(12) United States Patent
Terashima et al.

(10) Patent No.: US 11,245,365 B2
(45) Date of Patent: Feb. 8, 2022

(54) POWER AMPLIFIER CIRCUIT

(71) Applicant: Murata Manufacturing Co., Ltd., Kyoto (JP)

(72) Inventors: Toshikazu Terashima, Kyoto (JP); Satoshi Tanaka, Kyoto (JP); Kazuo Watanabe, Kyoto (JP); Makoto Itou, Kyoto (JP); Jun Enomoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/828,630

(22) Filed: Mar. 24, 2020

(65) Prior Publication Data
US 2020/0313629 A1 Oct. 1, 2020

(30) Foreign Application Priority Data
Mar. 25, 2019 (JP) .............................. JP2019-055964

(51) Int. Cl.
| | |
|---|---|
| *H03F 1/30* | (2006.01) |
| *H03F 1/56* | (2006.01) |
| *H03F 1/02* | (2006.01) |
| *H03F 3/213* | (2006.01) |
| *H03F 3/19* | (2006.01) |

(52) U.S. Cl.
CPC .......... *H03F 1/302* (2013.01); *H03F 1/0222* (2013.01); *H03F 1/0233* (2013.01); *H03F 1/565* (2013.01); *H03F 3/19* (2013.01); *H03F 3/213* (2013.01); *H03F 2200/144* (2013.01); *H03F 2200/361* (2013.01); *H03F 2200/363* (2013.01); *H03F 2200/451* (2013.01); *H03F 2200/555* (2013.01)

(58) Field of Classification Search
CPC ...................................................... H03F 1/302
See application file for complete search history.

(56) References Cited

U.S. PATENT DOCUMENTS

| | | | | |
|---|---|---|---|---|
| 6,137,367 A | * | 10/2000 | Ezzedine | ................ H03F 1/223 330/311 |
| 7,579,914 B2 | | 8/2009 | Amano | |

(Continued)

FOREIGN PATENT DOCUMENTS

| | | |
|---|---|---|
| JP | 2005-033650 A | 2/2005 |
| JP | 2008-109621 A | 5/2008 |

(Continued)

*Primary Examiner* — Patricia T Nguyen
(74) *Attorney, Agent, or Firm* — Pearne & Gordon LLP

(57) ABSTRACT

A power amplifier circuit includes a first transistor, a capacitor, and a second transistor. The first transistor has an emitter electrically connected to a reference potential, a base, and a collector electrically connected to a first power supply potential. A first end of the capacitor is electrically connected to the collector of the first transistor. The second transistor has an emitter electrically connected to a second end of the capacitor and electrically connected to the reference potential, a base, and a collector electrically connected to the first power supply potential. An RF output signal obtained by amplifying the RF input signal is output from the collector of the second transistor. A second bias circuit includes a third transistor having a collector electrically connected to a second power supply potential, a base, and an emitter from which the second bias current or voltage is output.

13 Claims, 37 Drawing Sheets

(56) References Cited

U.S. PATENT DOCUMENTS

| | | | |
|---|---|---|---|
| 2005/0007200 A1 | 1/2005 | Inoue et al. | |
| 2011/0043284 A1 | 2/2011 | Zhao et al. | |
| 2015/0145594 A1* | 5/2015 | Scott | H03F 3/19 |
| | | | 330/2 |
| 2016/0322944 A1 | 11/2016 | Hase | |
| 2018/0006608 A1 | 1/2018 | Tanaka et al. | |
| 2018/0062579 A1 | 3/2018 | Tanaka et al. | |
| 2018/0152143 A1 | 5/2018 | Tanaka et al. | |
| 2018/0248524 A1 | 8/2018 | Honda et al. | |
| 2020/0014344 A1* | 1/2020 | Arayashiki | H03F 1/0211 |
| 2020/0366256 A1* | 11/2020 | Pehlivanoglu | H03F 1/08 |

FOREIGN PATENT DOCUMENTS

| | | |
|---|---|---|
| JP | 2010-021869 A | 1/2010 |
| JP | 2013-502847 A | 1/2013 |
| JP | 2013-211830 A | 10/2013 |
| JP | 2016-213557 A | 12/2016 |
| JP | 2018-007029 A | 1/2018 |
| JP | 2018-033028 A | 3/2018 |
| JP | 2018-085689 A | 5/2018 |
| JP | 2018-142833 A | 9/2018 |

\* cited by examiner

POWER AMPLIFIER CIRCUIT

This application claims priority from Japanese Patent Application No. 2019-055964 filed on Mar. 25, 2019. The content of this application is incorporated herein by reference in its entirety.

BACKGROUND

The present disclosure relates to a power amplifier circuit. In power amplifier circuits, output power can be increased by increasing a power supply voltage. A booster circuit is required to increase the power supply voltage. It is therefore desirable to increase output power without necessarily increasing a power supply voltage.

Japanese Unexamined Patent Application Publication No. 2018-85689 describes a power amplifier circuit that increases the output power without necessarily increasing the power supply voltage.

In power amplifiers, a decrease in output impedance provides the merit of increasing output power and the demerit of decreasing power-added efficiency. An increase in output impedance provides the merit of increasing power-added efficiency and the demerit of decreasing output power. In power amplifiers, therefore, output impedance is an important factor. Desirably, the output impedance provides an optimal trade-off between output power and power-added efficiency.

BRIEF SUMMARY

Accordingly, the present disclosure achieves a desired trade-off between output power and power-added efficiency.

According to embodiments of the present disclosure, a power amplifier circuit includes a first bias circuit that outputs a first bias current or voltage; a second bias circuit that outputs a second bias current or voltage; a first transistor having an emitter, a base, and a collector, wherein the emitter is electrically connected to a reference potential, the first bias current or voltage is input to the base via a first resistor, a radio-frequency input signal is input to the base via a first capacitor, and the collector is electrically connected to a first power supply potential via a first inductor; a capacitor having a first end and a second end, the first end being electrically connected to the collector of the first transistor; and a second transistor having an emitter, a base, and a collector, wherein the emitter is electrically connected to the second end of the capacitor, the emitter is electrically connected to the reference potential via a second inductor, the second bias current or voltage is input to the base via a second resistor, the base is electrically connected to the reference potential via a second capacitor, the collector is electrically connected to the first power supply potential via a third inductor, and a radio-frequency output signal obtained by amplifying the radio-frequency input signal is output from the collector. The second bias circuit includes a third transistor having a collector, a base, and an emitter, wherein the collector is electrically connected to a second power supply potential, a third bias current or voltage is input to the base, and the second bias current or voltage is output from the emitter.

According to embodiments of the present disclosure, a power amplifier circuit includes a first bias circuit that outputs a first bias current or voltage; a second bias circuit that outputs a second bias current or voltage; a first transistor having an emitter, a base, and a collector, wherein the emitter is electrically connected to a reference potential, the first bias current or voltage is input to the base via a first resistor, a radio-frequency input signal is input to the base via a first capacitor, and the collector is electrically connected to a first power supply potential via a first inductor; a capacitor having a first end and a second end, the first end being electrically connected to the collector of the first transistor; and a second transistor having an emitter, a base, and a collector, wherein the emitter is electrically connected to the second end of the capacitor, the emitter is electrically connected to the reference potential via a second inductor, the second bias current or voltage is input to the base via a second resistor, the base is electrically connected to the reference potential via a second capacitor, the collector is electrically connected to the first power supply potential via a third inductor, and a radio-frequency output signal obtained by amplifying the radio-frequency input signal is output from the collector. A ratio of an impedance of the collector of the second transistor to an impedance of the collector of the first transistor is greater than or equal to about 2.2 and less than or equal to about 2.7.

According to embodiments of the present disclosure, it may be possible to achieve a desired trade-off between output power and power-added efficiency.

Other features, elements, characteristics and advantages of the present disclosure will become more apparent from the following detailed description of embodiments of the present disclosure with reference to the attached drawings.

DETAILED DESCRIPTION

The following describes power amplifier circuits according to embodiments of the present disclosure in detail with reference to the drawings. It should be understood that the present disclosure is not limited to these embodiments. The embodiments are illustrative, and configurations provided in different embodiments may be partially replaced or combined. In the second and subsequent embodiments, description of matters common to the first embodiment is omitted, and only the differences will be described. In particular, similar operational effects achieved with similar configurations will not be described again in the individual embodiments.

First Embodiment

Figure 1:
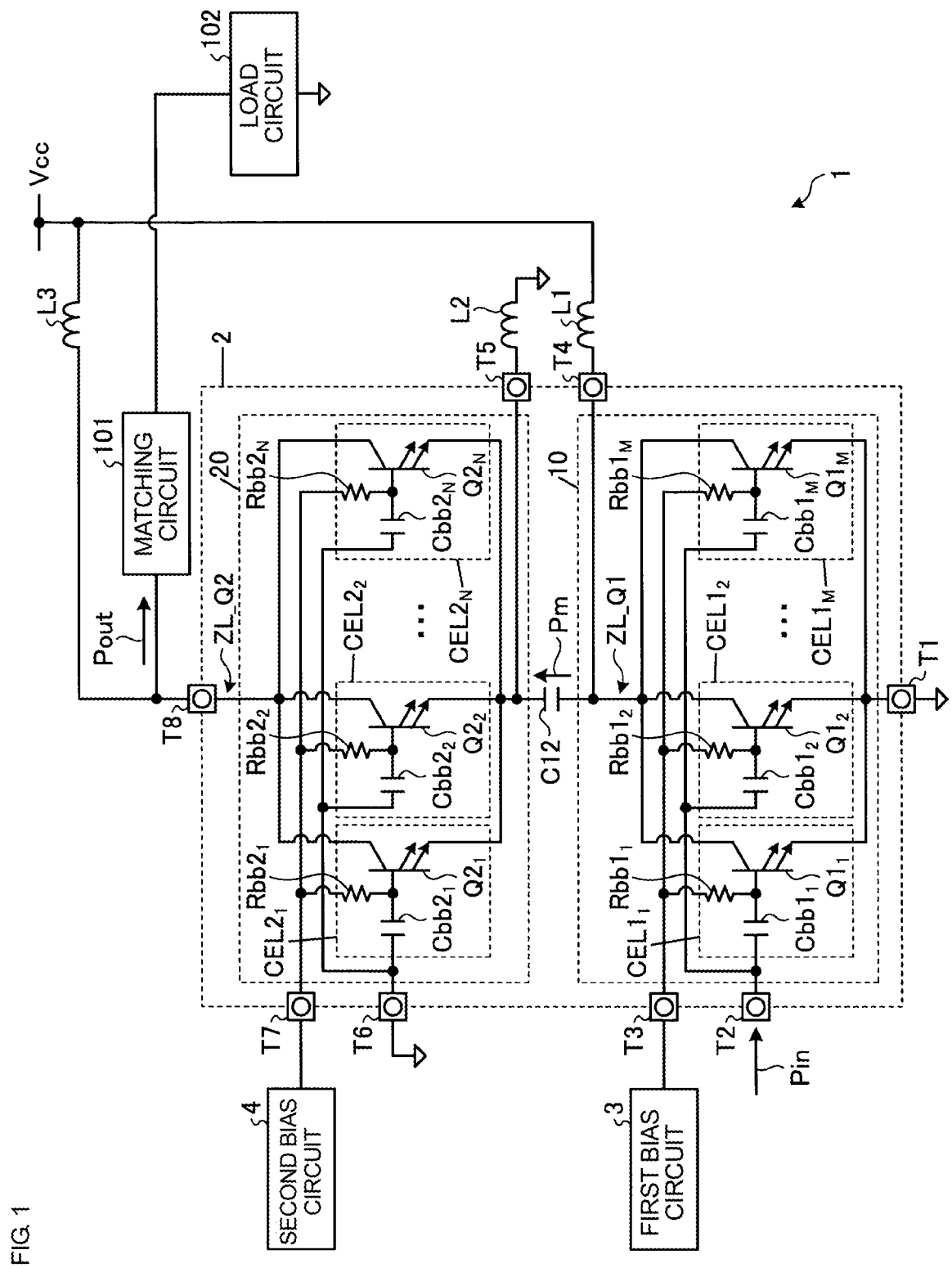
FIG. 1 illustrates a circuit configuration of a power amplifier circuit according to a first embodiment.

FIG. 1 illustrates a circuit configuration of a power amplifier circuit 1 according to a first embodiment. The power amplifier circuit 1 includes a power amplifier 2, a first bias circuit 3, a second bias circuit 4, a first inductor L1, a second inductor L2, and a third inductor L3.

The power amplifier circuit 1 is mounted in, for example, a mobile communication device such as a mobile phone device to amplify a radio-frequency (RF) input signal Pin and output an RF output signal Pout. The RF input signal Pin and the RF output signal Pout have frequencies in the range from about several hundreds of megahertz (MHz) to about several tens of gigahertz (GHz) for illustrative purposes, and the present disclosure is not limited thereto.

The power amplifier 2 may be formed on a semiconductor chip (or die), although the present disclosure is not limited thereto. The first inductor L1, the second inductor L2, and the third inductor L3 may be formed on a substrate having the semiconductor chip mounted thereon, although the present disclosure is not limited thereto.

The power amplifier 2 includes a first power amplifier 10, a second power amplifier 20, and a capacitor C12.

The capacitor C12 is electrically connected between the first power amplifier 10 and the second power amplifier 20. The capacitor C12 blocks direct current (DC) while passing alternating current (AC). That is, the capacitor C12 is a DC-cut capacitor. Specifically, the capacitor C12 isolates (blocks) the first power amplifier 10 and the second power amplifier 20 from each other for DC and couples (connects) the first power amplifier 10 and the second power amplifier 20 to each other for AC.

The first power amplifier 10 amplifies the RF input signal Pin and outputs an amplified RF signal Pm to the capacitor C12. The capacitor C12 passes the RF signal Pm. The second power amplifier 20 amplifies the RF signal Pm that is passed through the capacitor C12 and outputs the amplified RF output signal Pout.

The first power amplifier 10 includes M cells $CEL1_1$, $CEL1_2$, ..., and $CEL1_M$ that are connected in parallel with each other, where M is a natural number. The cells $CEL1_1$, $CEL1_2$, ..., and $CEL1_M$ include transistors $Q1_1$, $Q1_2$, ..., and $Q1_M$, respectively. The cells $CEL1_1$, $CEL1_2$, ..., and $CEL1_M$ include capacitors $Cbb1_1$, $Cbb1_2$, ..., and $Cbb1_M$, respectively. The cells $CEL1_1$, $CEL1_2$, ..., and $CEL1_M$ include resistors $Rbb1_1$, $Rbb1_2$, ..., and $Rbb1_M$, respectively. The term "cell", as used herein, is defined as having a configuration in which a transistor, a capacitor, and a resistor are connected to each other.

In the present disclosure, each transistor is a heterojunction bipolar transistor (HBT) for illustrative purposes, and the present disclosure is not limited thereto.

The emitters of the transistors $Q1_1$, $Q1_2$, ..., and $Q1_M$ are electrically connected to a reference potential via a terminal T1. The reference potential is a ground potential for illustrative purposes, and the present disclosure is not limited thereto.

The bases of the transistors $Q1_1$, $Q1_2$, ..., and $Q1_M$ are electrically connected to first ends of the capacitors $Cbb1_1$, $Cbb1_2$, ..., and $Cbb1_M$, respectively. Second ends of the capacitors $Cbb1_1$, $Cbb1_2$, ..., and $Cbb1_M$ are electrically connected to a terminal T2. The RF input signal Pin is input to the terminal T2. The capacitors $Cbb1_1$, $Cbb1_2$, ..., and $Cbb1_M$ are DC-cut capacitors each configured to block the DC component of the RF input signal Pin and to pass the AC component of the RF input signal Pin.

The bases of the transistors $Q1_1$, $Q1_2$, ..., and $Q1_M$ are electrically connected to first ends of the resistors $Rbb1_1$, $Rbb1_2$, ..., and $Rbb1_M$, respectively. Second ends of the resistors $Rbb1_1$, $Rbb1_2$, ..., and $Rbb1_M$ are electrically connected to a terminal T3. A bias current or bias voltage is input to the terminal T3 from the first bias circuit 3.

The bias current or voltage input from the first bias circuit 3 to the terminal T3 corresponds to a "first bias current or voltage" of the present disclosure.

The collectors of the transistors $Q1_1$, $Q1_2$, ..., and $Q1_M$ are electrically connected to a terminal T4. A first end of the first inductor L1 is electrically connected to the terminal T4. A second end of the first inductor L1 is electrically connected to a power supply potential Vcc. The first inductor L1 is a choke inductor that passes DC while blocking AC to prevent coupling of RF signals to a power supply circuit.

The power supply potential Vcc corresponds to a "first power supply potential" of the present disclosure. The power supply potential Vcc may be an envelope tracking (ET) power supply or a normal DC power supply.

The collectors of the transistors $Q1_1$, $Q1_2$, ..., and $Q1_M$ are electrically connected to a first end of the capacitor C12.

In the following description, the cells $CEL1_1$, $CEL1_2$, ..., and $CEL1_M$ are sometimes referred to collectively as a "cell CEL1". The transistors $Q1_1$, $Q1_2$, ..., and $Q1_M$ are sometimes referred to collectively as a "transistor Q1". The capacitors $Cbb1_1$, $Cbb1_2$, ..., and $Cbb1_M$ are sometimes referred to collectively as a "capacitor Cbb1". The resistors $Rbb1_1$, $Rbb1_2$, ..., and $Rbb1_M$ are sometimes referred to collectively as a "resistor Rbb1".

The cell CEL1 corresponds to a "first cell" of the present disclosure. The transistor Q1 corresponds to a "first transistor" of the present disclosure. The capacitor Cbb1 corresponds to a "first capacitor" of the present disclosure. The resistor Rbb1 corresponds to a "first resistor" of the present disclosure.

In the first power amplifier 10, in summary, the power supply potential Vcc is supplied to the collector of the transistor Q1 via the first inductor L1, and the emitter of the transistor Q1 is grounded. Further, a bias current or a bias voltage is supplied to the base of the transistor Q1 from the first bias circuit 3, and the RF input signal Pin is input to the base of the transistor Q1. Accordingly, the transistor Q1 amplifies the RF input signal Pin and outputs the amplified RF signal Pm to the second power amplifier 20 via the capacitor C12.

The second power amplifier 20 includes N cells $CEL2_1$, $CEL2_2$, ..., and $CEL2_N$ that are connected in parallel with each other, where N is a natural number.

The number N of cells $CEL2_1$, $CEL2_2$, ..., and $CEL2_N$ may be the same as or different from the number M of cells $CEL1_1$, $CEL1_2$, ..., and $CEL1_M$.

The cells $CEL2_1$, $CEL2_2$, ..., and $CEL2_N$ include transistors $Q2_1$, $Q2_2$, ..., and $Q2_N$, respectively. The cells $CEL2_1$, $CEL2_2$, ..., and $CEL2_N$ include capacitors $Cbb2_1$, $Cbb2_2$, ..., and $Cbb2_N$, respectively. The cells $CEL2_1$, $CEL2_2$, ..., and $CEL2_N$ include resistors $Rbb2_1$, $Rbb2_2$, ..., and $Rbb2_N$, respectively.

The emitters of the transistors $Q2_1$, $Q2_2$, ..., and $Q2_N$ are electrically connected to a second end of the capacitor C12.

The emitters of the transistors $Q2_1$, $Q2_2$, ..., and $Q2_N$ are electrically connected to a terminal T5. A first end of the second inductor L2 is electrically connected to the terminal T5. A second end of the second inductor L2 is electrically connected to the reference potential. The second inductor L2 is a choke inductor that passes DC while blocking AC.

The bases of the transistors $Q2_1$, $Q2_2$, ..., and $Q2_N$ are electrically connected to first ends of the capacitors $Cbb2_1$, $Cbb2_2$, ..., and $Cbb2_N$, respectively. Second ends of the capacitors $Cbb2_1$, $Cbb2_2$, ..., and $Cbb2_N$ are electrically connected to a terminal T6. The terminal T6 is electrically connected to the reference potential. The capacitors $Cbb2_1$, $Cbb2_2$, ..., and $Cbb2_N$ block DC while passing AC.

The bases of the transistors $Q2_1$, $Q2_2$, ..., and $Q2_N$ are electrically connected to first ends of the resistors $Rbb2_1$, $Rbb2_2$, ..., and $Rbb2_N$, respectively. Second ends of the resistors $Rbb2_1$, $Rbb2_2$, ..., and $Rbb2_N$ are electrically connected to a terminal T7. A bias current or bias voltage is input to the terminal T7 from the second bias circuit 4.

The bias current or voltage input from the second bias circuit 4 to the terminal T7 corresponds to a "second bias current or voltage" of the present disclosure.

The collectors of the transistors $Q2_1$, $Q2_2$, . . . , and $Q2_N$ are electrically connected to a terminal T8. A first end of the third inductor L3 is electrically connected to the terminal T8. A second end of the third inductor L3 is electrically connected to the power supply potential Vcc. The third inductor L3 is a choke inductor that passes DC while blocking AC to prevent coupling of RF signals to a power supply circuit.

A first end of a matching circuit 101 is electrically connected to the terminal T8. A second end of the matching circuit 101 is electrically connected to a first end of a load circuit 102. The matching circuit 101 is configured using an inductor and a capacitor for illustrative purposes, and the present disclosure is not limited thereto. The load circuit 102 is a front-end circuit connected to an antenna for illustrative purposes, and the present disclosure is not limited thereto.

In the following description, the cells $CEL2_1$, $CEL2_2$, . . . , and $CEL2_N$ are sometimes referred to collectively as a "cell CEL2". The transistors $Q2_1$, $Q2_2$, . . . , and $Q2_N$ are sometimes referred to collectively as a "transistor Q2". The capacitors $Cbb2_1$, $Cbb2_2$, . . . , and $Cbb2_N$ are sometimes referred to collectively as a "capacitor Cbb2". The resistors $Rbb2_1$, $Rbb2_2$, . . . , and $Rbb2_N$ are sometimes referred to collectively as a "resistor Rbb2".

The cell CEL2 corresponds to a "second cell" of the present disclosure. The transistor Q2 corresponds to a "second transistor" of the present disclosure. The capacitor Cbb2 corresponds to a "second capacitor" of the present disclosure. The resistor Rbb2 corresponds to a "second resistor" of the present disclosure.

In the second power amplifier 20, in summary, the power supply potential Vcc is supplied to the collector of the transistor Q2 via the third inductor L3, and the emitter of the transistor Q2 is grounded via the second inductor L2. The RF signal Pm is input to the emitter of the transistor Q2 from the first power amplifier 10 via the capacitor C12. A bias current or a bias voltage is supplied to the base of the transistor Q2 from the second bias circuit 4. Accordingly, the transistor Q2 amplifies the RF signal Pm and outputs the amplified RF output signal Pout to the load circuit 102 via the matching circuit 101.

The operation of the power amplifier 2 will be described in detail. In the following description, the power supply potential Vcc is set to 3 volts (hereinafter sometimes referred to as "DC3V"), although the present disclosure is not limited thereto.

The first end of the capacitor C12 is electrically connected to the collector of the transistor Q1, and the second end of the capacitor C12 is electrically connected to the emitter of the transistor Q2. The capacitor C12 isolates the transistor Q1 and the transistor Q2 from each other for DC and couples the transistor Q1 and the transistor Q2 to each other for AC.

The first end of the second inductor L2 is electrically connected to the emitter of the transistor Q2, and the second end of the second inductor L2 is grounded. The second inductor L2 has high impedance to high frequencies and thus does not affect the amplification of RF signals. That is, the second inductor L2 grounds the emitter of the transistor Q2 for DC.

Description will be given focusing on the transistor Q1. The emitter of the transistor Q1 is grounded, and the power supply potential Vcc (here, DC3V) is supplied to the collector of the transistor Q1 via the first inductor L1. Accordingly, the RF signal Pm has an amplitude swing of ±3 V for AC (hereinafter sometimes referred to as AC±3V). That is, the collector potential of the transistor Q1 varies over a range of 3 V±3 V, that is, a range from 0 V to +6 V.

Description will be given focusing on the transistor Q2. The emitter of the transistor Q2 is grounded for DC, resulting in DC0V, and is coupled (connected) to the collector of the transistor Q1 for AC, resulting in AC±3V. Thus, the emitter voltage of the transistor Q2 varies over a range of 0 V±3 V, that is, a range from −3 V to +3 V.

The collector of the transistor Q2 is supplied with the power supply potential Vcc for DC, and thus the collector potential of the transistor Q2 is DC3V. For AC, the collector potential of the transistor Q2 is in a range of AC±6V including the range over which the emitter voltage of the transistor Q2 varies. Accordingly, the RF output signal Pout has an amplitude swing of AC±6V. That is, the collector potential of the transistor Q2 varies over a range of 3 V±6 V, that is, a range from −3 V to +9 V.

The collector of the transistor Q2 has a signal amplitude of 12 V (from −3 V to +9 V), which is substantially twice as large as the signal amplitude of the collector of the transistor Q1, that is, 6 V (from 0 V to +6 V).

As described above, the power amplifier 2 has a cascode configuration in which the first power amplifier 10 and the second power amplifier 20 are connected to each other via the capacitor C12. With this configuration, the power amplifier 2 can increase the amplitude of the RF output signal Pout (for example, 12 V, from −3 V to +9 V) to a value that is about twice as large as the amplitude of an output signal of a power amplifier with a single configuration (for example, 6 V, from 0 V to +6 V). That is, the power amplifier 2 can increase the amplitude of the RF output signal Pout without necessarily increasing the power supply potential using a booster circuit.

Given that the output power of a signal is denoted by P, the collector voltage is denoted by V, and the load impedance is denoted by R, a relation of $P=V^2/R$ is satisfied. Assuming that the load impedance R is kept constant, when the collector voltage V is doubled, the output power P is substantially quadrupled. Accordingly, the power amplifier 2 can increase the output power, compared to that of a power amplifier with a single configuration, by increasing the amplitude of the RF output signal Pout without necessarily increasing the power supply potential.

Assuming that the output power P is kept constant, when the collector voltage V is doubled, the load impedance R is substantially quadrupled. In general, as the load impedance increases, the impedance transformation ratio of a matching circuit decreases. The impedance transformation ratio is a transformation ratio for performing impedance matching for a load circuit. Accordingly, the band-pass loss and the return loss of the matching circuit are reduced, and the power-added efficiency (PAE) improves. Also in this embodiment, the load impedance increases with an increase in the amplitude of the RF output signal Pout, resulting in a decrease in the impedance transformation ratio of the matching circuit 101. Thus, the power amplifier 2 provides improved power-added efficiency with reduced loss of the RF output signal Pout in the matching circuit 101, compared to a power amplifier with a single configuration. As described above, the power amplifier 2 can also improve power-added efficiency.

In typical power amplifiers, a decrease in output impedance provides the merit of increasing output power and the demerit of decreasing power-added efficiency. An increase in output impedance provides the merit of increasing power-added efficiency and the demerit of decreasing output power.

In power amplifiers, therefore, output impedance is an important factor. Desirably, the output impedance provides an optimal trade-off between output power and power-added efficiency.

In this embodiment, the output impedance of the first power amplifier 10 (collector impedance of the transistor Q1) and the output impedance of the second power amplifier 20 (collector impedance of the transistor Q2) are important factors. Desirably, the output impedance of the first power amplifier 10 and the output impedance of the second power amplifier 20 can achieve a desired trade-off between the output power and power-added efficiency of the power amplifier 2.

The present inventors performed circuit simulation on the power amplifier 2. The following describes results of the circuit simulation. First, description will be given of a case where a collector impedance ZL_Q2 of the transistor Q2 has no imaginary part. Later, description will be given of a case where the collector impedance ZL_Q2 of the transistor Q2 has an imaginary part. As described later, the real part of the ratio of the collector impedance ZL_Q2 of the transistor Q2 to a collector impedance ZL_Q1 of the transistor Q1, that is, Re(ZL_Q2/ZL_Q1), is substantially the same when the collector impedance ZL_Q2 of the transistor Q2 has an imaginary part and when the collector impedance ZL_Q2 of the transistor Q2 has no imaginary part. Accordingly, the present disclosure is not limited to the case where the collector impedance ZL_Q2 of the transistor Q2 has no imaginary part. This also applies to the second and subsequent embodiments.

Case where the Collector Impedance of the Transistor Q2 has No Imaginary Part

The circuit simulation was based on the assumption that an impedance Zref of the load circuit 102 was set to 6 ohms (Ω). Further, the collector impedance ZL_Q2 of the transistor Q2 was set to various values (such as 2Ω, 4Ω, 6Ω, 8Ω, and 10Ω).

In the present disclosure, the default values of the circuit constants of the respective elements are that Cbb2=0.32 picofarads (pF)/cell, Rbb2=1500 Ω/cell, and the number of cells N=24. The default value of the frequency of the RF input signal Pin is 3.3 GHz.

FIGS. 2 to 6 illustrate circuit simulation results of the power amplifier circuit 1 according to the first embodiment.

Figure 2:
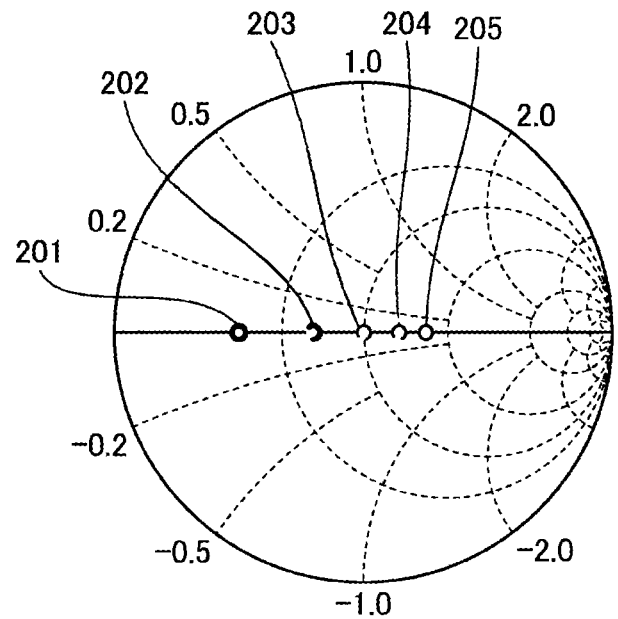
FIG. 2 illustrates circuit simulation results of the power amplifier circuit according to the first embodiment.
Figure 3:
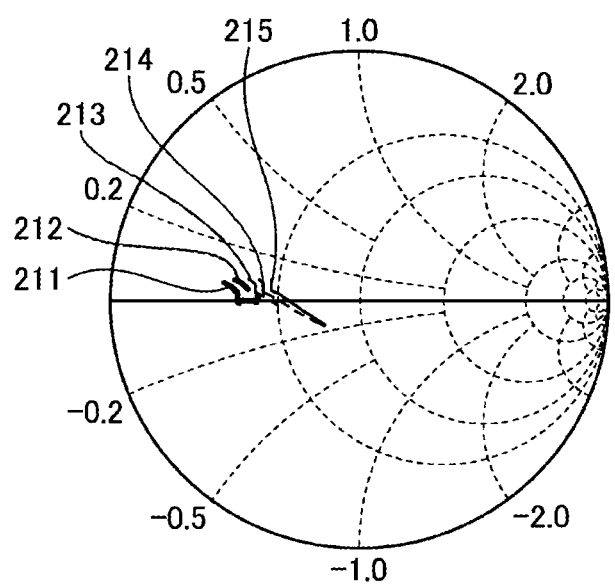
FIG. 3 illustrates circuit simulation results of the power amplifier circuit according to the first embodiment.

FIG. 2 is a Smith chart of the collector impedance ZL_Q2 of the transistor Q2. FIG. 3 is a Smith chart of the collector impedance ZL_Q1 of the transistor Q1.

In FIG. 2, point 201 is a point at which the collector impedance ZL_Q2 of the transistor Q2 is 2Ω. Point 202 is a point at which the collector impedance ZL_Q2 of the transistor Q2 is 4Ω.

Point 203 is a point at which the collector impedance ZL_Q2 of the transistor Q2 is 6Ω. Point 204 is a point at which the collector impedance ZL_Q2 of the transistor Q2 is 8Ω. Point 205 is a point at which the collector impedance ZL_Q2 of the transistor Q2 is 10Ω.

In FIG. 3, line 211 represents the locus of the collector impedance ZL_Q1 of the transistor Q1 when the collector impedance ZL_Q2 of the transistor Q2 was set to 2Ω. The collector impedance ZL_Q1 of the transistor Q1 is the ratio of the collector voltage (Vc_Q1) of the transistor Q1 and the collector current (Ic_Q1) of the transistor Q1 and is calculated by ZL_Q1=Vc_Q1/Ic_Q1. Line 212 represents the locus of the collector impedance ZL_Q1 of the transistor Q1 when the collector impedance ZL_Q2 of the transistor Q2 was set to 4Ω. Line 213 represents the locus of the collector impedance ZL_Q1 of the transistor Q1 when the collector impedance ZL_Q2 of the transistor Q2 was set to 6Ω.

Line 214 represents the locus of the collector impedance ZL_Q1 of the transistor Q1 when the collector impedance ZL_Q2 of the transistor Q2 was set to 8Ω. Line 215 represents the locus of the collector impedance ZL_Q1 of the transistor Q1 when the collector impedance ZL_Q2 of the transistor Q2 was set to 10Ω.

The operating state of the transistor Q1 changes in accordance with the set value of the collector impedance ZL_Q2 of the transistor Q2 and the output power of the power amplifier 2. Thus, the locus of the collector impedance ZL_Q1 of the transistor Q1 is indicated by a line.

Figure 4:
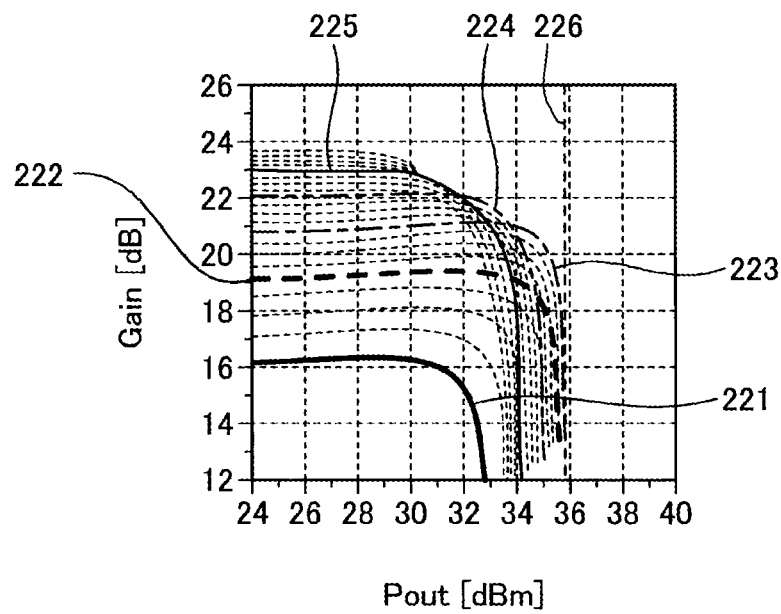
FIG. 4 illustrates circuit simulation results of the power amplifier circuit according to the first embodiment.

FIG. 4 illustrates a relationship between the signal strength (dBm) of the RF output signal Pout and the gain (dB) of the power amplifier 2.

Line 221 represents the locus of the gain of the power amplifier 2 when the collector impedance ZL_Q2 of the transistor Q2 was set to 2Ω. Line 222 represents the locus of the gain of the power amplifier 2 when the collector impedance ZL_Q2 of the transistor Q2 was set to 4Ω. Line 223 represents the locus of the gain of the power amplifier 2 when the collector impedance ZL_Q2 of the transistor Q2 was set to 6Ω.

Line 224 represents the locus of the gain of the power amplifier 2 when the collector impedance ZL_Q2 of the transistor Q2 was set to 8Ω. Line 225 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 6Ω ((6±α) Ω), thereby obtaining high gain. It is indicated that, for example, the collector impedance ZL_Q2 of the transistor Q2 is set to 6Ω, thereby obtaining gain with respect to the signal strength of the RF output signal Pout up to about 35.8 dBm, which is indicated by line 226.

Figure 5:
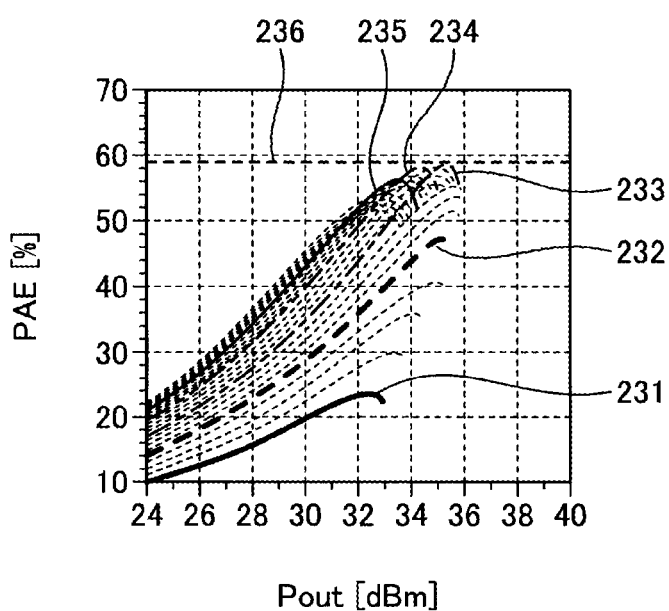
FIG. 5 illustrates circuit simulation results of the power amplifier circuit according to the first embodiment.

FIG. 5 illustrates a relationship between the signal strength (dBm) of the RF output signal Pout and the power-added efficiency (in percent (%)) of the power amplifier 2.

Line 231 represents the locus of the power-added efficiency of the power amplifier 2 when the collector impedance ZL_Q2 of the transistor Q2 was set to 2Ω. Line 232 represents the locus of the power-added efficiency of the power amplifier 2 when the collector impedance ZL_Q2 of the transistor Q2 was set to 4Ω. Line 233 represents the locus of the power-added efficiency of the power amplifier 2 when the collector impedance ZL_Q2 of the transistor Q2 was set to 6Ω.

Line 234 represents the locus of the power-added efficiency of the power amplifier 2 when the collector impedance ZL_Q2 of the transistor Q2 was set to 8Ω. Line 235 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 6Ω ((6±α) Ω), thereby obtaining high power-added efficiency. It is indicated that, for example, the collector impedance ZL_Q2 of the transistor Q2 is set to 6Ω, thereby obtaining a power-added efficiency of about 59%, which is indicated by line 236.

Figure 6:
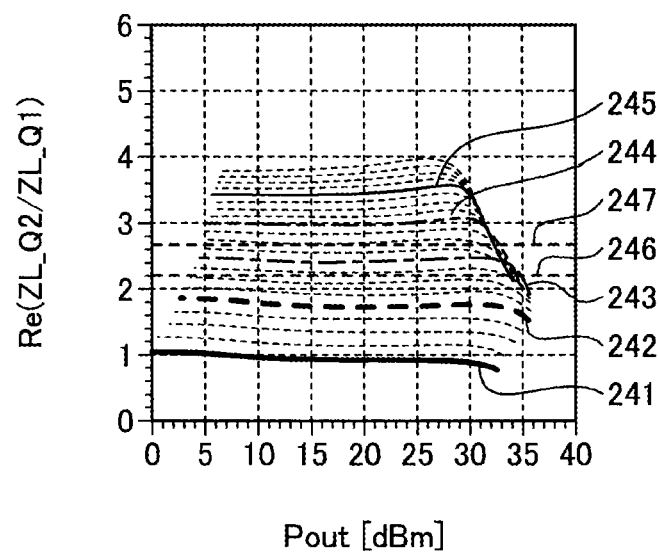
FIG. 6 illustrates circuit simulation results of the power amplifier circuit according to the first embodiment.

FIG. 6 illustrates a relationship between the signal strength (dBm) of the RF output signal Pout and the real part of the ratio of the collector impedance ZL_Q2 of the transistor Q2 to the collector impedance ZL_Q1 of the transistor Q1, namely, Re(ZL_Q2/ZL_Q1).

The real part of the ratio of the collector impedance ZL_Q2 of the transistor Q2 to the collector impedance ZL_Q1 of the transistor Q1, namely, Re(ZL_Q2/ZL_Q1), is hereinafter sometimes referred to as "impedance ratio".

Line 241 represents the locus of the impedance ratio when the collector impedance ZL_Q2 of the transistor Q2 was set to 2Ω. Line 242 represents the locus of the impedance ratio when the collector impedance ZL_Q2 of the transistor Q2 was set to 4Ω. Line 243 represents the locus of the impedance ratio when the collector impedance ZL_Q2 of the transistor Q2 was set to 6Ω.

Line 244 represents the locus of the impedance ratio when the collector impedance ZL_Q2 of the transistor Q2 was set to 8Ω. Line 245 represents the locus of the impedance ratio when the collector impedance ZL_Q2 of the transistor Q2 was set to 10Ω.

FIGS. 4 and 5 indicate that setting the collector impedance ZL_Q2 of the transistor Q2 to about 6Ω ((6±α) Ω) can achieve a desired trade-off between the output power and power-added efficiency of the power amplifier 2. FIG. 6 indicates that the impedance ratio providing the desired trade-off ranges from about 2.2, which is indicated by line 246, to about 2.7, which is indicated by line 247.

In the power amplifier 2, therefore, setting the impedance ratio to be greater than or equal to about 2.2 and less than or equal to about 2.7 can achieve a desired trade-off between the output power and power-added efficiency of the power amplifier 2.

First Case where the Collector Impedance of the Transistor Q2 has an Imaginary Part The circuit simulation was based on the assumption that the impedance Zref of the load circuit 102 was set to 6Ω. Further, the collector impedance ZL_Q2 of the transistor Q2 was set to various values (such as (2+j×1.2) Ω, (4+j×1.2) Ω, (6+j×1.2) Ω, (8+j×1.2) Ω, and (10+j×1.2) Ω).

FIGS. 7 to 11 illustrate circuit simulation results of the power amplifier circuit 1 according to the first embodiment.

Figure 7:
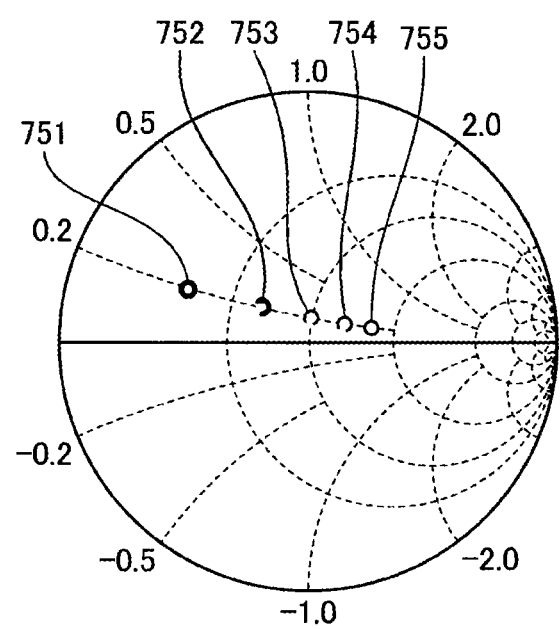
FIG. 7 illustrates circuit simulation results of the power amplifier circuit according to the first embodiment.
Figure 8:
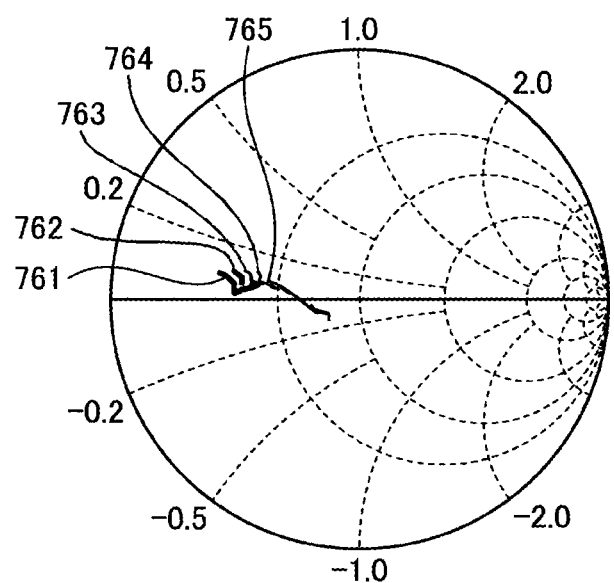
FIG. 8 illustrates circuit simulation results of the power amplifier circuit according to the first embodiment.

FIG. 7 is a Smith chart of the collector impedance ZL_Q2 of the transistor Q2. FIG. 8 is a Smith chart of the collector impedance ZL_Q1 of the transistor Q1.

In FIG. 7, point 751 is a point at which the collector impedance ZL_Q2 of the transistor Q2 is (2+j×1.2) Ω. Point 752 is a point at which the collector impedance ZL_Q2 of the transistor Q2 is (4+j×1.2) Ω.

Point 753 is a point at which the collector impedance ZL_Q2 of the transistor Q2 is (6+j×1.2) Ω. Point 754 is a point at which the collector impedance ZL_Q2 of the transistor Q2 is (8+j×1.2) Ω. Point 755 is a point at which the collector impedance ZL_Q2 of the transistor Q2 is (10+j×1.2) Ω.

In FIG. 8, line 761 represents the locus of the collector impedance ZL_Q1 of the transistor Q1 when the collector impedance ZL_Q2 of the transistor Q2 was set to (2+j×1.2) Ω. Line 762 represents the locus of the collector impedance ZL_Q1 of the transistor Q1 when the collector impedance ZL_Q2 of the transistor Q2 was set to (4+j×1.2) Ω. Line 763 represents the locus of the collector impedance ZL_Q1 of the transistor Q1 when the collector impedance ZL_Q2 of the transistor Q2 was set to (6+j×1.2) Ω.

Line 764 represents the locus of the collector impedance ZL_Q1 of the transistor Q1 when the collector impedance ZL_Q2 of the transistor Q2 was set to (8+j×1.2) Ω. Line 765 represents the locus of the collector impedance ZL_Q1 of the transistor Q1 when the collector impedance ZL_Q2 of the transistor Q2 was set to (10+j×1.2) Ω.

Figure 9:
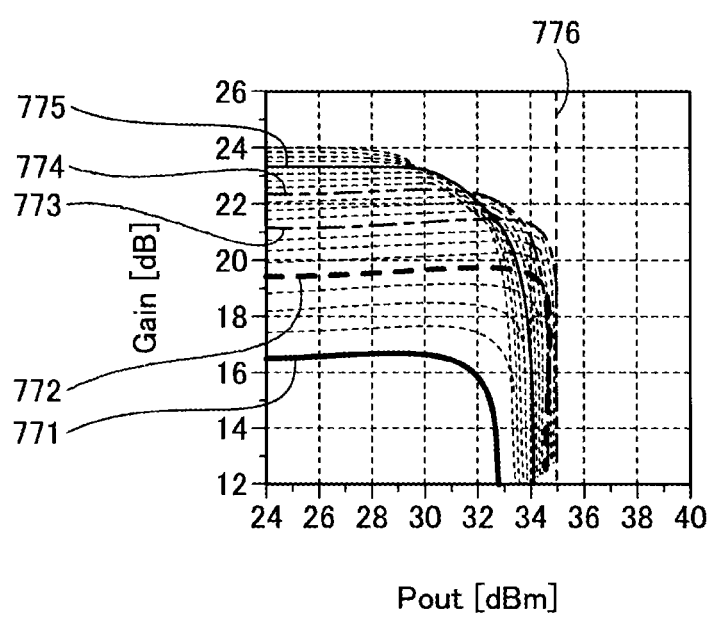
FIG. 9 illustrates circuit simulation results of the power amplifier circuit according to the first embodiment.

FIG. 9 illustrates a relationship between the signal strength (dBm) of the RF output signal Pout and the gain (dB) of the power amplifier 2.

Line 771 represents the locus of the gain of the power amplifier 2 when the collector impedance ZL_Q2 of the transistor Q2 was set to (2+j×1.2) Ω. Line 772 represents the locus of the gain of the power amplifier 2 when the collector impedance ZL_Q2 of the transistor Q2 was set to (4+j×1.2) Ω. Line 773 represents the locus of the gain of the power amplifier 2 when the collector impedance ZL_Q2 of the transistor Q2 was set to (6+j×1.2) Ω.

Line 774 represents the locus of the gain of the power amplifier 2 when the collector impedance ZL_Q2 of the transistor Q2 was set to (8+j×1.2) Ω. Line 775 represents the locus of the gain of the power amplifier 2 when the collector impedance ZL_Q2 of the transistor Q2 was set to (10+j×1.2) Ω.

It is indicated that in an area where the signal strength of the RF output signal Pout is high, the collector impedance ZL_Q2 of the transistor Q2 is set to about (6+j×1.2) S2 (((6+j×1.2)±α) Ω), thereby obtaining high gain. It is indicated that, for example, the collector impedance ZL_Q2 of the transistor Q2 is set to (6+j×1.2) Ω, thereby obtaining gain with respect to the signal strength of the RF output signal Pout up to about 35 dBm, which is indicated by line 776.

Figure 10:
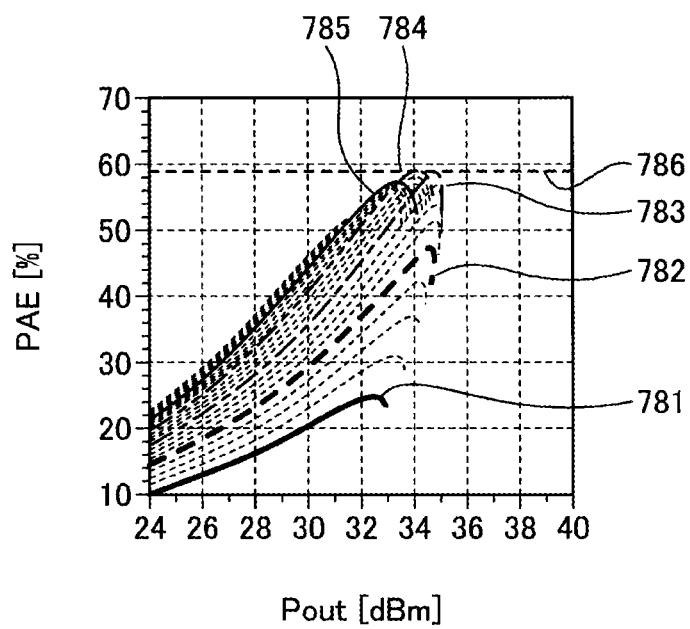
FIG. 10 illustrates circuit simulation results of the power amplifier circuit according to the first embodiment.

FIG. 10 illustrates a relationship between the signal strength (dBm) of the RF output signal Pout and the power-added efficiency (%) of the power amplifier 2.

Line 781 represents the locus of the power-added efficiency of the power amplifier 2 when the collector impedance ZL_Q2 of the transistor Q2 was set to (2+j×1.2) Ω. Line 782 represents the locus of the power-added efficiency of the power amplifier 2 when the collector impedance ZL_Q2 of the transistor Q2 was set to (4+j×1.2) Ω. Line 783 represents the locus of the power-added efficiency of the power amplifier 2 when the collector impedance ZL_Q2 of the transistor Q2 was set to (6+j×1.2) Ω.

Line 784 represents the locus of the power-added efficiency of the power amplifier 2 when the collector impedance ZL_Q2 of the transistor Q2 was set to (8+j×1.2) Ω. Line 785 represents the locus of the power-added efficiency of the power amplifier 2 when the collector impedance ZL_Q2 of the transistor Q2 was set to (10+j×1.2) Ω.

It is indicated that the collector impedance ZL_Q2 of the transistor Q2 is set to about (6+j×1.2) S2 (((6+j×1.2)±α) Ω), thereby obtaining high power-added efficiency. It is indicated that, for example, the collector impedance ZL_Q2 of the transistor Q2 is set to (6+j×1.2) Ω, thereby obtaining a power-added efficiency of about 59%, which is indicated by line 786.

Figure 11:
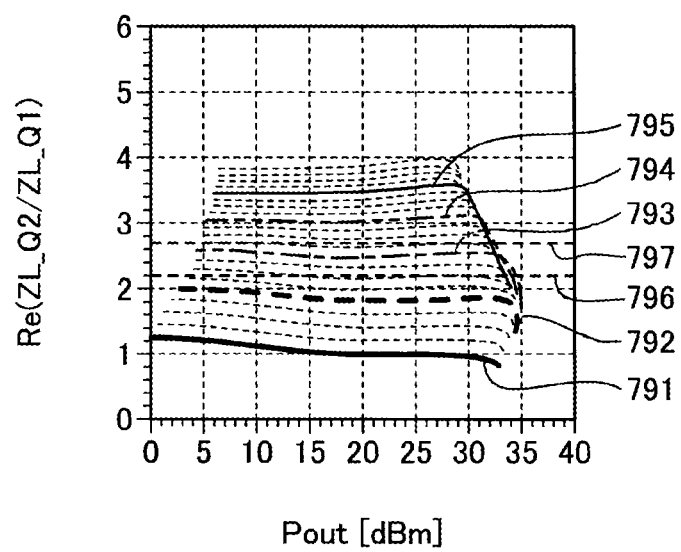
FIG. 11 illustrates circuit simulation results of the power amplifier circuit according to the first embodiment.

FIG. 11 illustrates a relationship between the signal strength (dBm) of the RF output signal Pout and the real part of the impedance ratio.

Line 791 represents the locus of the impedance ratio when the collector impedance ZL_Q2 of the transistor Q2 was set to (2+j×1.2) Ω. Line 792 represents the locus of the impedance ratio when the collector impedance ZL_Q2 of the transistor Q2 was set to (4+j×1.2) Ω. Line 793 represents the locus of the impedance ratio when the collector impedance ZL_Q2 of the transistor Q2 was set to (6+j×1.2) Ω.

Line 794 represents the locus of the impedance ratio when the collector impedance ZL_Q2 of the transistor Q2 was set to (8+j×1.2) Ω. Line 795 represents the locus of the impedance ratio when the collector impedance ZL_Q2 of the transistor Q2 was set to (10+j×1.2) Ω.

FIGS. 9 and 10 indicate that setting the collector impedance ZL_Q2 of the transistor Q2 to about (6+j×1.2) Ω (((6+j×1.2)±α) Ω) can achieve a desired trade-off between the output power and power-added efficiency of the power amplifier 2. FIG. 11 indicates that the impedance ratio providing the desired trade-off ranges from about 2.2, which is indicated by line 796, to about 2.7, which is indicated by line 797.

In the power amplifier 2, therefore, setting the impedance ratio to be greater than or equal to about 2.2 and less than or equal to about 2.7 can achieve a desired trade-off between the output power and power-added efficiency of the power amplifier 2.

Second Case where the Collector Impedance of the Transistor Q2 has an Imaginary Part The circuit simulation was based on the assumption that the impedance Zref of the load circuit 102 was set to 6Ω. Further, the collector impedance ZL_Q2 of the transistor Q2 was set to various values (such as (2−j×1.2) Ω, (4−j×1.2) Ω, (6−j×1.2) Ω, (8−j×1.2) Ω, and (10−j×1.2) Ω).

FIGS. 12 to 16 illustrate circuit simulation results of the power amplifier circuit 1 according to the first embodiment.

Figure 12:
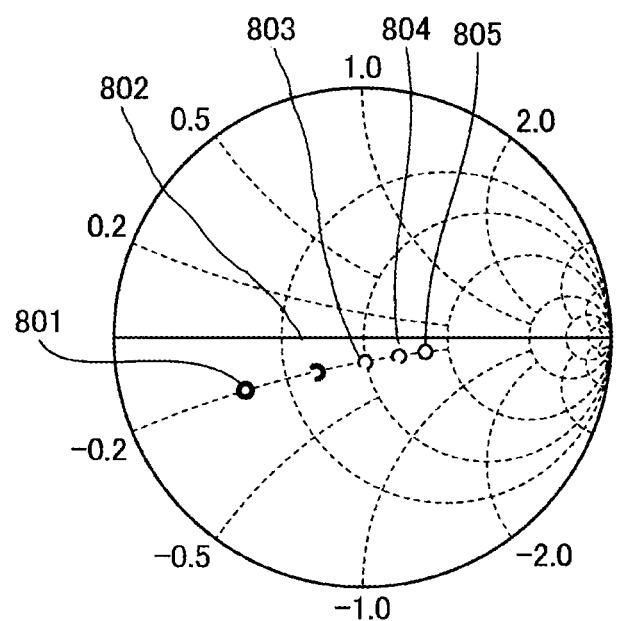
FIG. 12 illustrates circuit simulation results of the power amplifier circuit according to the first embodiment.
Figure 13:
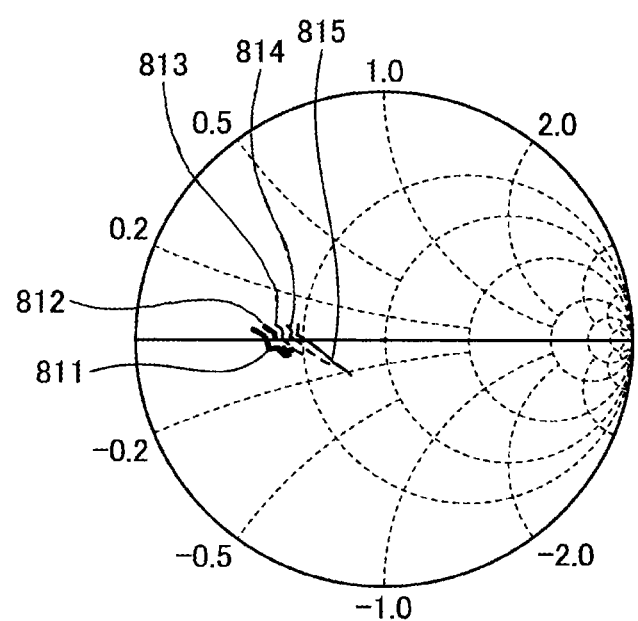
FIG. 13 illustrates circuit simulation results of the power amplifier circuit according to the first embodiment.

FIG. 12 is a Smith chart of the collector impedance ZL_Q2 of the transistor Q2. FIG. 13 is a Smith chart of the collector impedance ZL_Q1 of the transistor Q1.

In FIG. 12, point 801 is a point at which the collector impedance ZL_Q2 of the transistor Q2 is (2−j×1.2) Ω. Point 802 is a point at which the collector impedance ZL_Q2 of the transistor Q2 is (4−j×1.2) Ω.

Point 803 is a point at which the collector impedance ZL_Q2 of the transistor Q2 is (6−j×1.2) Ω. Point 804 is a point at which the collector impedance ZL_Q2 of the transistor Q2 is (8−j×1.2) Ω. Point 805 is a point at which the collector impedance ZL_Q2 of the transistor Q2 is (10−j×1.2) Ω.

In FIG. 13, line 811 represents the locus of the collector impedance ZL_Q1 of the transistor Q1 when the collector impedance ZL_Q2 of the transistor Q2 was set to (2−j×1.2) Ω. Line 812 represents the locus of the collector impedance ZL_Q1 of the transistor Q1 when the collector impedance ZL_Q2 of the transistor Q2 was set to (4−j×1.2) Ω. Line 813 represents the locus of the collector impedance ZL_Q1 of the transistor Q1 when the collector impedance ZL_Q2 of the transistor Q2 was set to (6−j×1.2) Ω.

Line 814 represents the locus of the collector impedance ZL_Q1 of the transistor Q1 when the collector impedance ZL_Q2 of the transistor Q2 was set to (8−j×1.2) Ω. Line 815 represents the locus of the collector impedance ZL_Q1 of the transistor Q1 when the collector impedance ZL_Q2 of the transistor Q2 was set to (10−j×1.2) Ω.

Figure 14:
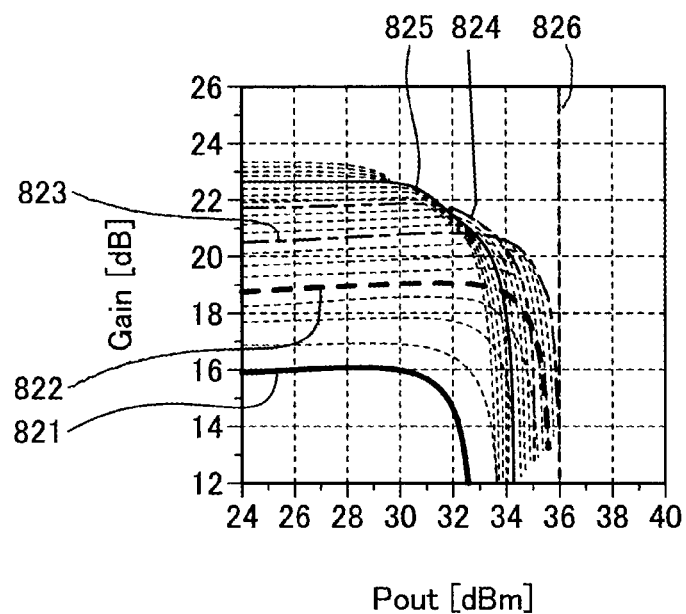
FIG. 14 illustrates circuit simulation results of the power amplifier circuit according to the first embodiment.

FIG. 14 illustrates a relationship between the signal strength (dBm) of the RF output signal Pout and the gain (dB) of the power amplifier 2.

Line 821 represents the locus of the gain of the power amplifier 2 when the collector impedance ZL_Q2 of the transistor Q2 was set to (2−j×1.2) Ω. Line 822 represents the locus of the gain of the power amplifier 2 when the collector impedance ZL_Q2 of the transistor Q2 was set to (4−j×1.2) Ω. Line 823 represents the locus of the gain of the power amplifier 2 when the collector impedance ZL_Q2 of the transistor Q2 was set to (6−j×1.2) Ω.

Line 824 represents the locus of the gain of the power amplifier 2 when the collector impedance ZL_Q2 of the transistor Q2 was set to (8−j×1.2) Ω. Line 825 represents the locus of the gain of the power amplifier 2 when the collector impedance ZL_Q2 of the transistor Q2 was set to (10−j×1.2) Ω.

It is indicated that in an area where the signal strength of the RF output signal Pout is high, the collector impedance ZL_Q2 of the transistor Q2 is set to about (6−j×1.2) Ω (((6−j×1.2)±α) Ω), thereby obtaining high gain. It is indicated that, for example, the collector impedance ZL_Q2 of the transistor Q2 is set to (6−j×1.2) Ω, thereby obtaining gain with respect to the signal strength of the RF output signal Pout up to about 36 dBm, which is indicated by line 826.

Figure 15:
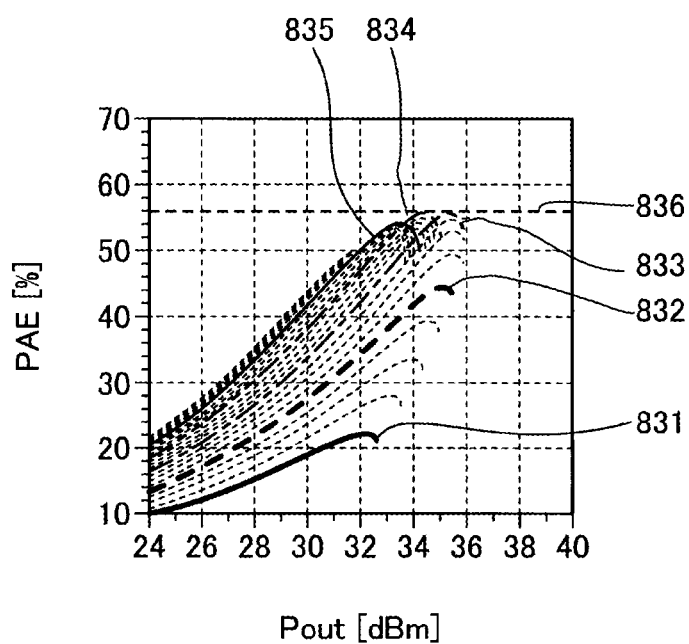
FIG. 15 illustrates circuit simulation results of the power amplifier circuit according to the first embodiment.

FIG. 15 illustrates a relationship between the signal strength (dBm) of the RF output signal Pout and the power-added efficiency (%) of the power amplifier 2.

Line 831 represents the locus of the power-added efficiency of the power amplifier 2 when the collector impedance ZL_Q2 of the transistor Q2 was set to (2−j×1.2) Ω. Line 832 represents the locus of the power-added efficiency of the power amplifier 2 when the collector impedance ZL_Q2 of the transistor Q2 was set to (4−j×1.2) Ω. Line 833 represents the locus of the power-added efficiency of the power amplifier 2 when the collector impedance ZL_Q2 of the transistor Q2 was set to (6−j×1.2) Ω.

Line 834 represents the locus of the power-added efficiency of the power amplifier 2 when the collector impedance ZL_Q2 of the transistor Q2 was set to (8−j×1.2) Ω. Line 835 represents the locus of the power-added efficiency of the power amplifier 2 when the collector impedance ZL_Q2 of the transistor Q2 was set to (10−j×1.2) Ω.

It is indicated that the collector impedance ZL_Q2 of the transistor Q2 is set to about (6−j×1.2) Ω (((6−j×1.2)±α) Ω), thereby obtaining high power-added efficiency. It is indicated that, for example, the collector impedance ZL_Q2 of the transistor Q2 is set to (6−j×1.2) Ω, thereby obtaining a power-added efficiency of about 56%, which is indicated by line 836.

Figure 16:
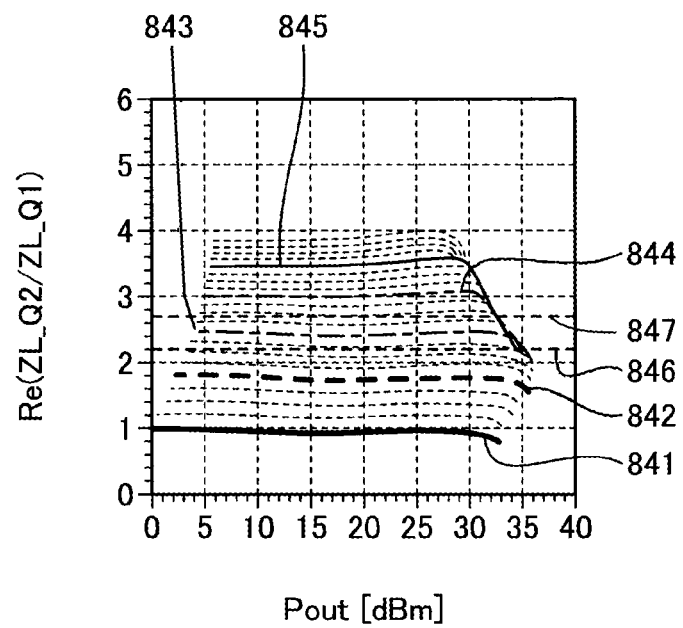
FIG. 16 illustrates circuit simulation results of the power amplifier circuit according to the first embodiment.

FIG. 16 illustrates a relationship between the signal strength (dBm) of the RF output signal Pout and the real part of the impedance ratio.

Line 841 represents the locus of the impedance ratio when the collector impedance ZL_Q2 of the transistor Q2 was set to (2−j×1.2) Ω. Line 842 represents the locus of the impedance ratio when the collector impedance ZL_Q2 of the transistor Q2 was set to (4−j×1.2) Ω. Line 843 represents the locus of the impedance ratio when the collector impedance ZL_Q2 of the transistor Q2 was set to (6−j×1.2) Ω.

Line 844 represents the locus of the impedance ratio when the collector impedance ZL_Q2 of the transistor Q2 was set to (8−j×1.2) Ω. Line 845 represents the locus of the impedance ratio when the collector impedance ZL_Q2 of the transistor Q2 was set to (10−j×1.2) Ω.

FIGS. 14 and 15 indicate that setting the collector impedance ZL_Q2 of the transistor Q2 to about (6−j×1.2) Ω (((6−j×1.2)±α) Ω) can achieve a desired trade-off between the output power and power-added efficiency of the power amplifier 2. FIG. 16 indicates that the impedance ratio providing the desired trade-off ranges from about 2.2, which is indicated by line 846, to about 2.7, which is indicated by line 847.

In the power amplifier 2, therefore, setting the impedance ratio to be greater than or equal to about 2.2 and less than or equal to about 2.7 can achieve a desired trade-off between the output power and power-added efficiency of the power amplifier 2.

Second Embodiment

A circuit configuration according to a second embodiment is similar to the circuit configuration according to the first embodiment (see FIG. 1) and will not be illustrated or described.

In the second embodiment, the electrostatic capacity of the capacitor Cbb2 is changed.

As the base impedance of the transistor Q2 changes, the emitter impedance of the transistor Q2 also changes. If the electrostatic capacity of the capacitor C12 has a sufficiently large value, the impedance of the capacitor C12 is sufficiently smaller than the emitter impedance of the transistor Q2. Thus, it holds true that (the emitter impedance of the transistor Q2) (the collector impedance of the transistor Q1). That is, adjusting the base impedance of the transistor Q2 can adjust the collector impedance ZL_Q1 of the transistor Q1.

Case where the Electrostatic Capacity of the Capacitor Cbb2 is Increased

When the electrostatic capacity of the capacitor Cbb2 is increased, the base impedance of the transistor Q2 decreases and the collector impedance ZL_Q1 of the transistor Q1 also decreases. Adjusting the collector impedance ZL_Q2 of the transistor Q2 so as to be decreased can adjust the impedance ratio to fall within the range of about 2.2 to about 2.7. A decrease in the collector impedance ZL_Q2 of the transistor Q2 corresponds to an increase in the gain (output power) of the power amplifier 2 (hereinafter sometimes referred to as "output matching").

Figure 17:
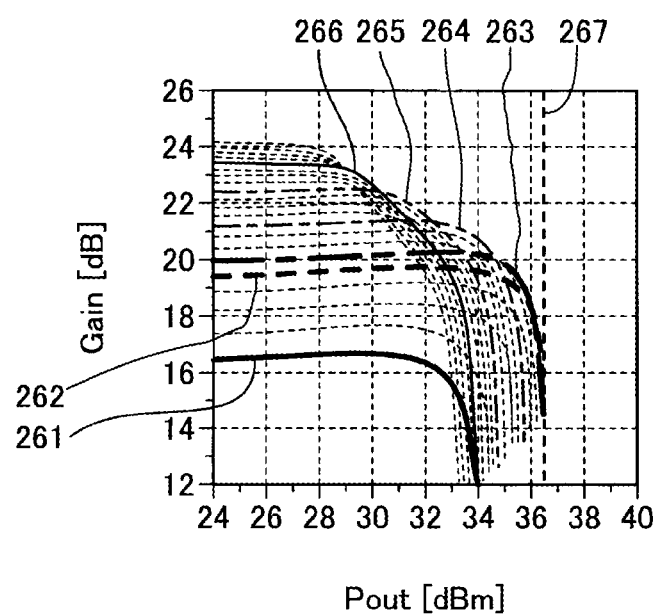
FIG. 17 illustrates circuit simulation results of a power amplifier circuit according to a second embodiment.
Figure 18:
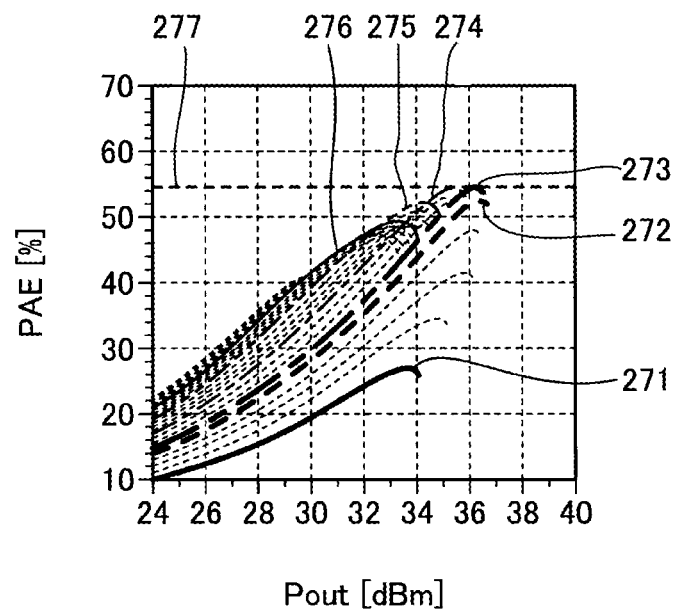
FIG. 18 illustrates circuit simulation results of the power amplifier circuit according to the second embodiment.
Figure 19:
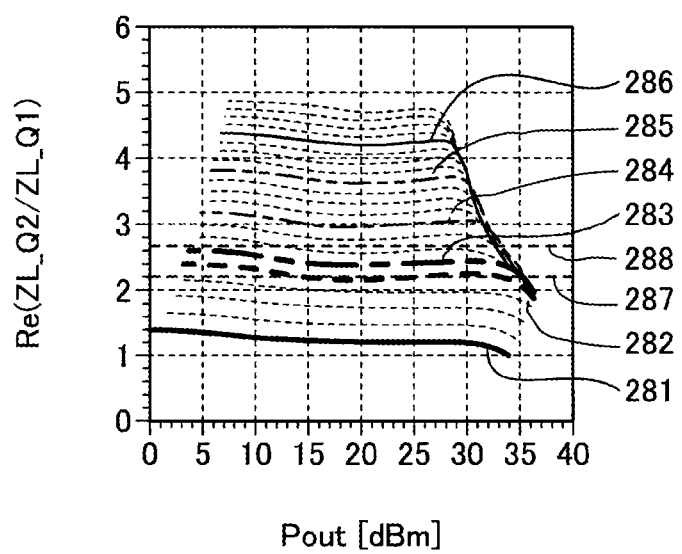
FIG. 19 illustrates circuit simulation results of the power amplifier circuit according to the second embodiment.

FIGS. 17 to 19 illustrate circuit simulation results of the power amplifier circuit 1 according to the second embodiment.

Here, the electrostatic capacity of the capacitor Cbb2 was set to satisfy Cbb2=0.64 pF/cell.

FIG. 17 illustrates a relationship between the signal strength (dBm) of the RF output signal Pout and the gain (dB) of the power amplifier 2.

Line 261 represents the locus of the gain of the power amplifier 2 when the collector impedance ZL_Q2 of the transistor Q2 was set to 2Ω. Line 262 represents the locus of the gain of the power amplifier 2 when the collector impedance ZL_Q2 of the transistor Q2 was set to 4Ω. Line 263 represents the locus of the gain of the power amplifier 2 when the collector impedance ZL_Q2 of the transistor Q2 was set to 4.5Ω.

Line 264 represents the locus of the gain of the power amplifier 2 when the collector impedance ZL_Q2 of the transistor Q2 was set to 6Ω. Line 265 represents the locus of the gain of the power amplifier 2 when the collector impedance ZL_Q2 of the transistor Q2 was set to 8Ω. Line 266 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 4.5Ω ((4.5±α) Ω), thereby obtaining high gain. It is indicated that, for example, the collector impedance ZL_Q2 of the transistor Q2 is set to 4.5Ω, thereby obtaining gain with respect to the signal strength of the RF output signal Pout up to about 36.5 dBm, which is indicated by line 267.

FIG. 18 illustrates a relationship between the signal strength (dBm) of the RF output signal Pout and the power-added efficiency (%) of the power amplifier 2.

Line 271 represents the locus of the power-added efficiency of the power amplifier 2 when the collector impedance ZL_Q2 of the transistor Q2 was set to 2Ω. Line 272 represents the locus of the power-added efficiency of the power amplifier 2 when the collector impedance ZL_Q2 of the transistor Q2 was set to 4Ω. Line 273 represents the locus of the power-added efficiency of the power amplifier 2 when the collector impedance ZL_Q2 of the transistor Q2 was set to 4.5Ω.

Line 274 represents the locus of the power-added efficiency of the power amplifier 2 when the collector impedance ZL_Q2 of the transistor Q2 was set to 6Ω. Line 275 represents the locus of the power-added efficiency of the power amplifier 2 when the collector impedance ZL_Q2 of the transistor Q2 was set to 8Ω. Line 276 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 4.5Ω ((4.5±α) Ω), thereby obtaining high power-added efficiency. It is indicated that, for example, the collector impedance ZL_Q2 of the transistor Q2 is set to 4.5Ω, thereby obtaining a power-added efficiency of about 55%, which is indicated by line 277.

FIG. 19 illustrates a relationship between the signal strength (dBm) of the RF output signal Pout and the impedance ratio.

Line 281 represents the locus of the impedance ratio when the collector impedance ZL_Q2 of the transistor Q2 was set to 2Ω. Line 282 represents the locus of the impedance ratio when the collector impedance ZL_Q2 of the transistor Q2 was set to 4Ω. Line 283 represents the locus of the impedance ratio when the collector impedance ZL_Q2 of the transistor Q2 was set to 4.5Ω.

Line 284 represents the locus of the impedance ratio when the collector impedance ZL_Q2 of the transistor Q2 was set to 6Ω. Line 285 represents the locus of the impedance ratio when the collector impedance ZL_Q2 of the transistor Q2 was set to 8Ω. Line 286 represents the locus of the impedance ratio when the collector impedance ZL_Q2 of the transistor Q2 was set to 10Ω.

FIGS. 17 and 18 indicate that setting the collector impedance ZL_Q2 of the transistor Q2 to about 4.5Ω ((4.5±α) Ω) can achieve a desired trade-off between the output power and power-added efficiency of the power amplifier 2. FIG. 19 indicates that the impedance ratio providing the desired trade-off ranges from about 2.2, which is indicated by line 287, to about 2.7, which is indicated by line 288.

In the power amplifier 2, therefore, setting the impedance ratio to be greater than or equal to about 2.2 and less than or equal to about 2.7 can achieve a desired trade-off between the output power and power-added efficiency of the power amplifier 2.

Case where the Electrostatic Capacity of the Capacitor Cbb2 is Decreased

When the electrostatic capacity of the capacitor Cbb2 is decreased, the base impedance of the transistor Q2 increases and the collector impedance ZL_Q1 of the transistor Q1 also increases. Adjusting the collector impedance ZL_Q2 of the transistor Q2 so as to be increased can adjust the impedance ratio to fall within the range of about 2.2 to about 2.7. An increase in the collector impedance ZL_Q2 of the transistor Q2 corresponds to an increase in the power-added efficiency (PAE) of the power amplifier 2 (hereinafter sometimes referred to as "efficiency matching").

Figure 20:
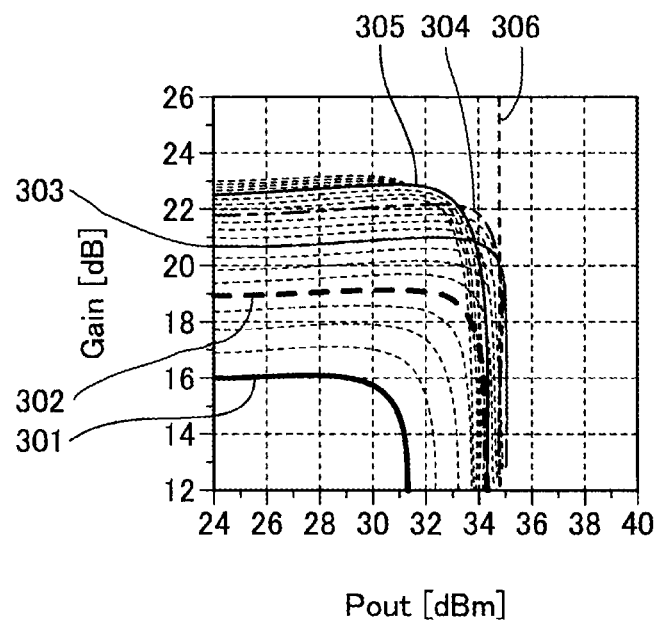
FIG. 20 illustrates circuit simulation results of the power amplifier circuit according to the second embodiment.
Figure 21:
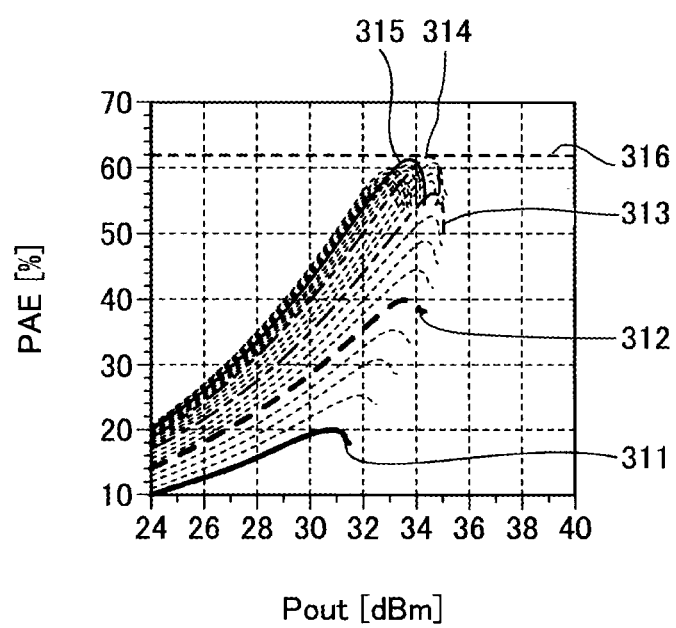
FIG. 21 illustrates circuit simulation results of the power amplifier circuit according to the second embodiment.
Figure 22:
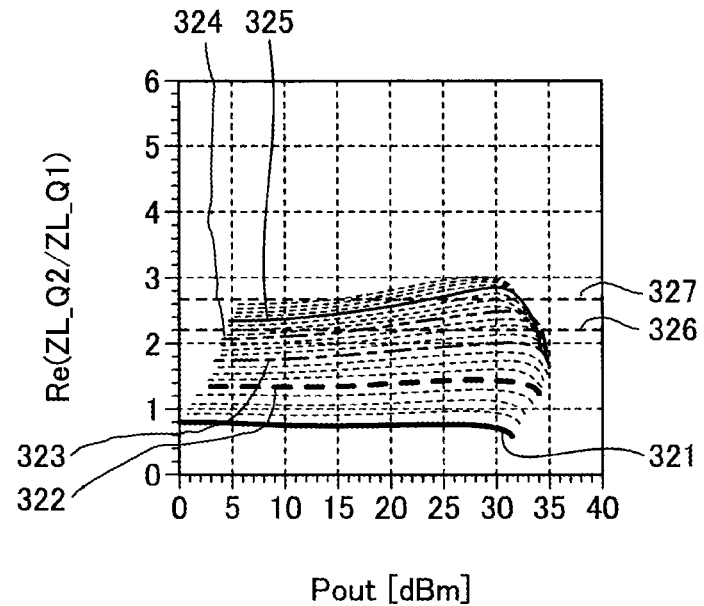
FIG. 22 illustrates circuit simulation results of the power amplifier circuit according to the second embodiment.

FIGS. 20 to 22 illustrate circuit simulation results of the power amplifier circuit 1 according to the second embodiment.

Here, the electrostatic capacity of the capacitor Cbb2 was set to satisfy Cbb2=0.16 pF/cell.

FIG. 20 illustrates a relationship between the signal strength (dBm) of the RF output signal Pout and the gain (dB) of the power amplifier 2.

Line 301 represents the locus of the gain of the power amplifier 2 when the collector impedance ZL_Q2 of the transistor Q2 was set to 2Ω. Line 302 represents the locus of the gain of the power amplifier 2 when the collector impedance ZL_Q2 of the transistor Q2 was set to 4Ω. Line 303 represents the locus of the gain of the power amplifier 2 when the collector impedance ZL_Q2 of the transistor Q2 was set to 6Ω.

Line 304 represents the locus of the gain of the power amplifier 2 when the collector impedance ZL_Q2 of the transistor Q2 was set to 8Ω. Line 305 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 6Ω to about 8Ω, thereby obtaining high gain. It is indicated that, for example, the collector impedance ZL_Q2 of the transistor Q2 is set to 6Ω or 8Ω, thereby obtaining gain with respect to the signal strength of the RF output signal Pout up to about 34.8 dBm, which is indicated by line 306.

FIG. 21 illustrates a relationship between the signal strength (dBm) of the RF output signal Pout and the power-added efficiency (%) of the power amplifier 2.

Line 311 represents the locus of the power-added efficiency of the power amplifier 2 when the collector impedance ZL_Q2 of the transistor Q2 was set to 2Ω. Line 312 represents the locus of the power-added efficiency of the power amplifier 2 when the collector impedance ZL_Q2 of the transistor Q2 was set to 4Ω. Line 313 represents the locus of the power-added efficiency of the power amplifier 2 when the collector impedance ZL_Q2 of the transistor Q2 was set to 6Ω.

Line 314 represents the locus of the power-added efficiency of the power amplifier 2 when the collector impedance ZL_Q2 of the transistor Q2 was set to 8Ω. Line 315 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 6Ω to about 8Ω, thereby obtaining high power-added efficiency. It is indicated that, for example, the collector impedance ZL_Q2 of the transistor Q2 is set to 6Ω or 8Ω, thereby obtaining a power-added efficiency of about 62%, which is indicated by line 316.

FIG. 22 illustrates a relationship between the signal strength (dBm) of the RF output signal Pout and the impedance ratio.

Line 321 represents the locus of the impedance ratio when the collector impedance ZL_Q2 of the transistor Q2 was set to 2Ω. Line 322 represents the locus of the impedance ratio when the collector impedance ZL_Q2 of the transistor Q2 was set to 4Ω. Line 323 represents the locus of the impedance ratio when the collector impedance ZL_Q2 of the transistor Q2 was set to 6Ω.

Line 324 represents the locus of the impedance ratio when the collector impedance ZL_Q2 of the transistor Q2 was set to 8Ω. Line 325 represents the locus of the impedance ratio when the collector impedance ZL_Q2 of the transistor Q2 was set to 10Ω.

FIGS. 20 and 21 indicate that setting the collector impedance ZL_Q2 of the transistor Q2 to about 6Ω to about 8Ω (or about 7Ω ((7±α) Ω)) can achieve a desired trade-off between the output power and power-added efficiency of the power amplifier 2. FIG. 22 indicates that the impedance ratio providing the desired trade-off ranges from about 2.2, which is indicated by line 326, to about 2.7, which is indicated by line 327.

In the power amplifier 2, therefore, setting the impedance ratio to be greater than or equal to about 2.2 and less than or equal to about 2.7 can achieve a desired trade-off between the output power and power-added efficiency of the power amplifier 2.

Third Embodiment

A circuit configuration according to a third embodiment is similar to the circuit configuration according to the first embodiment (see FIG. 1) and will not be illustrated or described.

In the third embodiment, the resistance value of the resistor Rbb2 is changed.

As described in the second embodiment, adjusting the base impedance of the transistor Q2 can adjust the collector impedance ZL_Q1 of the transistor Q1.

Case where the Resistance Value of the Resistor Rbb2 is Decreased

When the resistance value of the resistor Rbb2 is decreased, the base impedance of the transistor Q2 decreases and the collector impedance ZL_Q1 of the transistor Q1 also decreases. Adjusting the collector impedance ZL_Q2 of the transistor Q2 so as to be decreased can adjust the impedance ratio to fall within the range of about 2.2 to about 2.7. A decrease in the collector impedance ZL_Q2 of the transistor Q2 corresponds to an increase in the gain (output power) of the power amplifier 2 (output matching).

Figure 23:
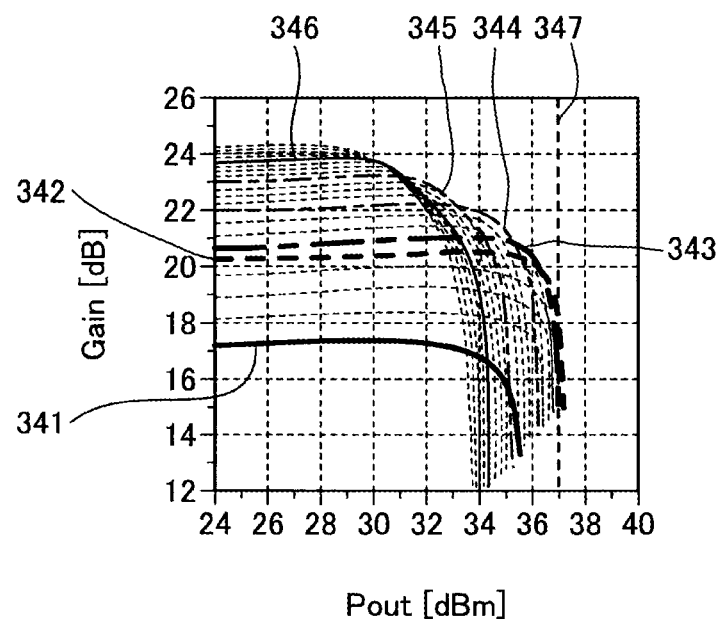
FIG. 23 illustrates circuit simulation results of a power amplifier circuit according to a third embodiment.
Figure 24:
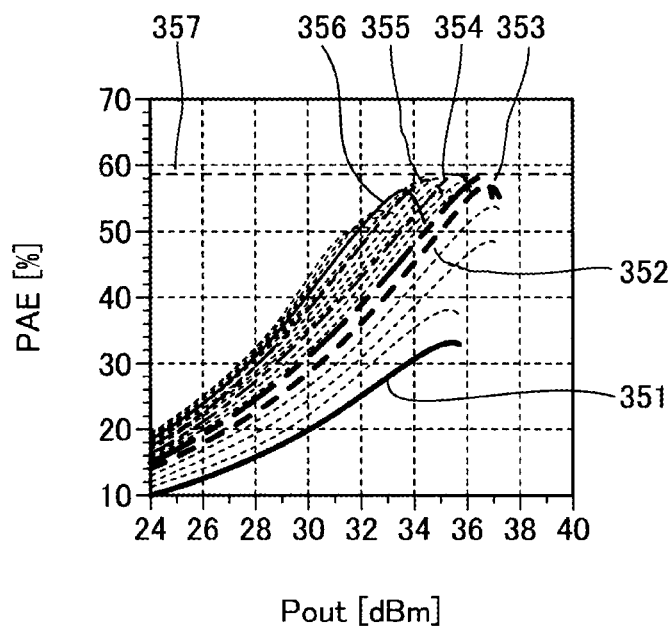
FIG. 24 illustrates circuit simulation results of the power amplifier circuit according to the third embodiment.
Figure 25:
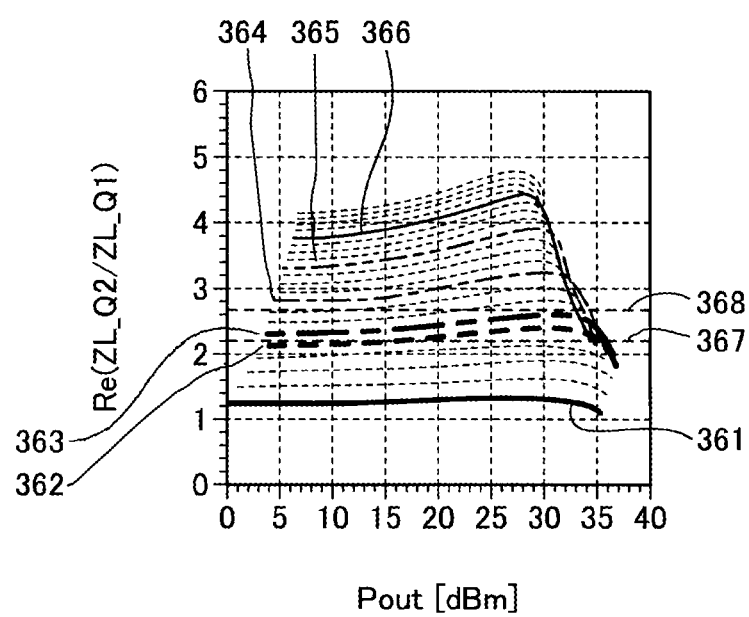
FIG. 25 illustrates circuit simulation results of the power amplifier circuit according to the third embodiment.

FIGS. 23 to 25 illustrate circuit simulation results of the power amplifier circuit 1 according to the third embodiment.

Here, the resistance value of the resistor Rbb2 was set to satisfy Rbb2=750 Ω/cell.

FIG. 23 illustrates a relationship between the signal strength (dBm) of the RF output signal Pout and the gain (dB) of the power amplifier 2.

Line 341 represents the locus of the gain of the power amplifier 2 when the collector impedance ZL_Q2 of the transistor Q2 was set to 2Ω. Line 342 represents the locus of the gain of the power amplifier 2 when the collector impedance ZL_Q2 of the transistor Q2 was set to 4Ω. Line 343 represents the locus of the gain of the power amplifier 2 when the collector impedance ZL_Q2 of the transistor Q2 was set to 4.5Ω.

Line 344 represents the locus of the gain of the power amplifier 2 when the collector impedance ZL_Q2 of the transistor Q2 was set to 6Ω. Line 345 represents the locus of the gain of the power amplifier 2 when the collector impedance ZL_Q2 of the transistor Q2 was set to 8Ω. Line 346 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 4.5Ω ((4.5±α) Ω), thereby obtaining high gain. It is indicated that, for example, the collector impedance ZL_Q2 of the transistor Q2 is set to 4.5Ω, thereby obtaining gain with respect to the signal strength of the RF output signal Pout up to about 36.8 dBm, which is indicated by line 347.

FIG. 24 illustrates a relationship between the signal strength (dBm) of the RF output signal Pout and the power-added efficiency (%) of the power amplifier 2.

Line 351 represents the locus of the power-added efficiency of the power amplifier 2 when the collector impedance ZL_Q2 of the transistor Q2 was set to 2Ω. Line 352 represents the locus of the power-added efficiency of the power amplifier 2 when the collector impedance ZL_Q2 of the transistor Q2 was set to 4Ω. Line 353 represents the locus of the power-added efficiency of the power amplifier 2 when the collector impedance ZL_Q2 of the transistor Q2 was set to 4.5Ω.

Line 354 represents the locus of the power-added efficiency of the power amplifier 2 when the collector impedance ZL_Q2 of the transistor Q2 was set to 6Ω. Line 355 represents the locus of the power-added efficiency of the power amplifier 2 when the collector impedance ZL_Q2 of the transistor Q2 was set to 8Ω. Line 356 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 4.5Ω ((4.5±α) Ω), thereby obtaining high power-added efficiency. It is indicated that, for example, the collector impedance ZL_Q2 of the transistor Q2 is set to 4.5Ω, thereby obtaining a power-added efficiency of about 58%, which is indicated by line 357.

FIG. 25 illustrates a relationship between the signal strength (dBm) of the RF output signal Pout and the impedance ratio.

Line 361 represents the locus of the impedance ratio when the collector impedance ZL_Q2 of the transistor Q2 was set to 2Ω. Line 362 represents the locus of the impedance ratio when the collector impedance ZL_Q2 of the transistor Q2 was set to 4Ω. Line 363 represents the locus of the impedance ratio when the collector impedance ZL_Q2 of the transistor Q2 was set to 4.5Ω.

Line 364 represents the locus of the impedance ratio when the collector impedance ZL_Q2 of the transistor Q2 was set to 6Ω. Line 365 represents the locus of the impedance ratio when the collector impedance ZL_Q2 of the transistor Q2 was set to 8Ω. Line 366 represents the locus of the impedance ratio when the collector impedance ZL_Q2 of the transistor Q2 was set to 10Ω.

FIGS. 23 and 24 indicate that setting the collector impedance ZL_Q2 of the transistor Q2 to about 4.5Ω ((4.5±α) Ω) can achieve a desired trade-off between the output power and power-added efficiency of the power amplifier 2. FIG. 25 indicates that the impedance ratio providing the desired trade-off ranges from about 2.2, which is indicated by line 367, to about 2.7, which is indicated by line 368.

In the power amplifier 2, therefore, setting the impedance ratio to be greater than or equal to about 2.2 and less than or equal to about 2.7 can achieve a desired trade-off between the output power and power-added efficiency of the power amplifier 2.

Case where the Resistance Value of the Resistor Rbb2 is Increased

When the resistance value of the resistor Rbb2 is increased, the base impedance of the transistor Q2 increases and the collector impedance ZL_Q1 of the transistor Q1 also increases. Adjusting the collector impedance ZL_Q2 of the transistor Q2 so as to be increased can adjust the impedance ratio to fall within the range of about 2.2 to about 2.7. An increase in the collector impedance ZL_Q2 of the transistor Q2 corresponds to an increase in the power-added efficiency (PAE) of the power amplifier 2 (efficiency matching).

Figure 26:
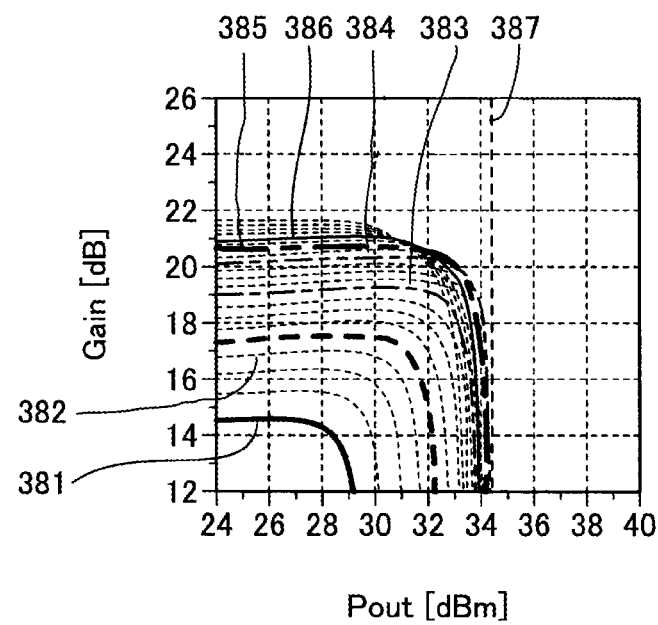
FIG. 26 illustrates circuit simulation results of the power amplifier circuit according to the third embodiment.
Figure 27:
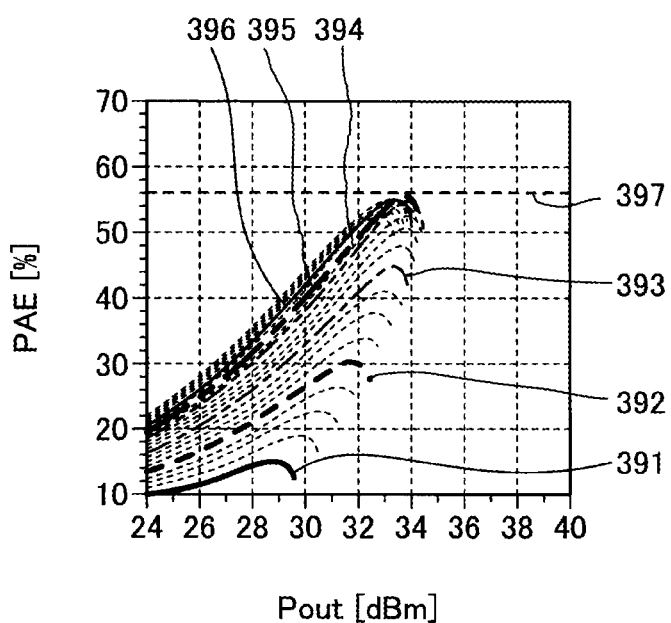
FIG. 27 illustrates circuit simulation results of the power amplifier circuit according to the third embodiment.
Figure 28:
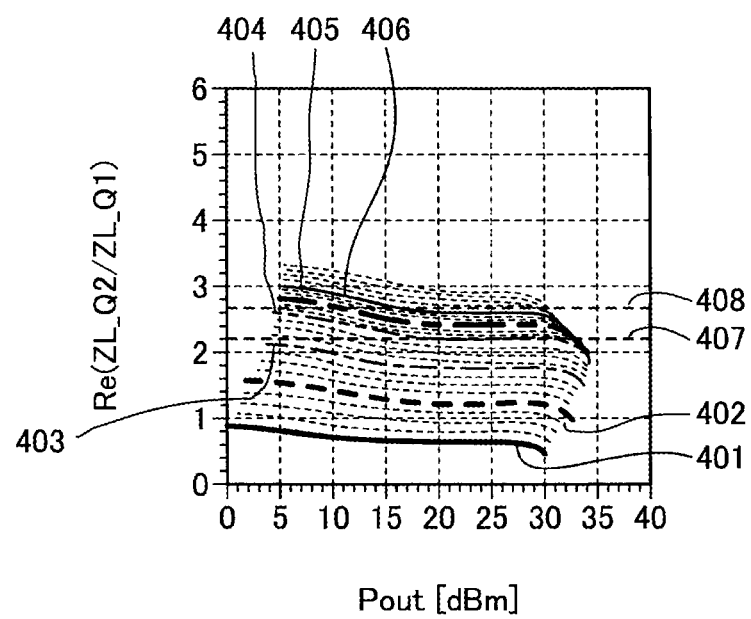
FIG. 28 illustrates circuit simulation results of the power amplifier circuit according to the third embodiment.

FIGS. 26 to 28 illustrate circuit simulation results of the power amplifier circuit 1 according to the third embodiment. Here, the resistance value of the resistor Rbb2 was set to satisfy Rbb2=3000 Ω/cell.

FIG. 26 illustrates a relationship between the signal strength (dBm) of the RF output signal Pout and the gain (dB) of the power amplifier 2.

Line 381 represents the locus of the gain of the power amplifier 2 when the collector impedance ZL_Q2 of the transistor Q2 was set to 2Ω. Line 382 represents the locus of the gain of the power amplifier 2 when the collector impedance ZL_Q2 of the transistor Q2 was set to 4Ω. Line 383 represents the locus of the gain of the power amplifier 2 when the collector impedance ZL_Q2 of the transistor Q2 was set to 6Ω.

Line 384 represents the locus of the gain of the power amplifier 2 when the collector impedance ZL_Q2 of the transistor Q2 was set to 8Ω. Line 385 represents the locus of the gain of the power amplifier 2 when the collector impedance ZL_Q2 of the transistor Q2 was set to 9Ω. Line 386 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 9Ω ((9±α) Ω), thereby obtaining high gain. It is indicated that, for example, the collector impedance ZL_Q2 of the transistor Q2 is set to 9Ω, thereby obtaining gain with respect to the signal strength of the RF output signal Pout up to about 34.4 dBm, which is indicated by line 387.

FIG. 27 illustrates a relationship between the signal strength (dBm) of the RF output signal Pout and the power-added efficiency (%) of the power amplifier 2.

Line 391 represents the locus of the power-added efficiency of the power amplifier 2 when the collector impedance ZL_Q2 of the transistor Q2 was set to 2Ω. Line 392 represents the locus of the power-added efficiency of the power amplifier 2 when the collector impedance ZL_Q2 of the transistor Q2 was set to 4Ω. Line 393 represents the locus of the power-added efficiency of the power amplifier 2 when the collector impedance ZL_Q2 of the transistor Q2 was set to 6Ω.

Line 394 represents the locus of the power-added efficiency of the power amplifier 2 when the collector impedance ZL_Q2 of the transistor Q2 was set to 8Ω. Line 395 represents the locus of the power-added efficiency of the power amplifier 2 when the collector impedance ZL_Q2 of the transistor Q2 was set to 9Ω. Line 396 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 9Ω ((9±α)Ω), thereby obtaining high power-added efficiency. It is indicated that, for example, the collector impedance ZL_Q2 of the transistor Q2 is set to 9Ω, thereby obtaining a power-added efficiency of about 56%, which is indicated by line 397.

FIG. 28 illustrates a relationship between the signal strength (dBm) of the RF output signal Pout and the impedance ratio.

Line 401 represents the locus of the impedance ratio when the collector impedance ZL_Q2 of the transistor Q2 was set to 2Ω. Line 402 represents the locus of the impedance ratio when the collector impedance ZL_Q2 of the transistor Q2 was set to 4Ω. Line 403 represents the locus of the impedance ratio when the collector impedance ZL_Q2 of the transistor Q2 was set to 6Ω.

Line 404 represents the locus of the impedance ratio when the collector impedance ZL_Q2 of the transistor Q2 was set to 8Ω. Line 405 represents the locus of the impedance ratio when the collector impedance ZL_Q2 of the transistor Q2 was set to 9Ω. Line 406 represents the locus of the impedance ratio when the collector impedance ZL_Q2 of the transistor Q2 was set to 10Ω.

FIGS. 26 and 27 indicate that setting the collector impedance ZL_Q2 of the transistor Q2 to about 9Ω ((9±α) Ω) can achieve a desired trade-off between the output power and power-added efficiency of the power amplifier 2. FIG. 28 indicates that the impedance ratio providing the desired trade-off ranges from about 2.2, which is indicated by line 407, to about 2.7, which is indicated by line 408.

In the power amplifier 2, therefore, setting the impedance ratio to be greater than or equal to about 2.2 and less than or equal to about 2.7 can achieve a desired trade-off between the output power and power-added efficiency of the power amplifier 2.

Fourth Embodiment

A circuit configuration according to a fourth embodiment is similar to the circuit configuration according to the first embodiment (see FIG. 1) and will not be illustrated or described.

In the fourth embodiment, the number of cells N of the transistor Q2 is changed.

The number of cells N of the transistor Q2 is changed, instead of changing the resistance value of the resistor Rbb2 (the resistors $Rbb2_1$, $Rbb2_2$, . . . , and $Rbb2_N$) or the electrostatic capacity value of the capacitor Cbb2 (the capacitors $Cbb2_1$, $Cbb2_2$, . . . , and $Cbb2_N$). Changing the number of cells N of the transistor Q2 can change the resistance value of the resistor Rbb2 and the electrostatic capacity value of the capacitor Cbb2 in the transistor Q2. Accordingly, as in the second embodiment and the third embodiment, the base impedance of the transistor Q2 can be changed, and the collector impedance ZL_Q1 of the transistor Q1 can be changed.

Case where the Number of Cells N is Increased

When the number of cells N is increased, the resistance value of the resistor Rbb2 decreases and the electrostatic capacity value of the capacitor Cbb2 increases. Accordingly, the base impedance of the transistor Q2 decreases and the collector impedance ZL_Q1 of the transistor Q1 also decreases. Adjusting the collector impedance ZL_Q2 of the transistor Q2 so as to be decreased can adjust the impedance ratio to fall within the range of about 2.2 to about 2.7 (output matching).

Case where the Number of Cells N is Decreased

When the number of cells N is decreased, the resistance value of the resistor Rbb2 increases and the electrostatic capacity value of the capacitor Cbb2 decreases. Accordingly, the base impedance of the transistor Q2 increases and the collector impedance ZL_Q1 of the transistor Q1 also increases. Adjusting the collector impedance ZL_Q2 of the transistor Q2 so as to be increased can adjust the impedance ratio to fall within the range of about 2.2 to about 2.7 (efficiency matching).

In the power amplifier 2, setting the impedance ratio to be greater than or equal to about 2.2 and less than or equal to about 2.7 can achieve a desired trade-off between the output power and power-added efficiency of the power amplifier 2.

In the fourth embodiment, furthermore, both the resistance value of the resistor Rbb2 and the electrostatic capacity value of the capacitor Cbb2 can be changed simultaneously by changing the number of cells N of the transistor Q2.

Fifth Embodiment

A circuit configuration according to a fifth embodiment is similar to the circuit configuration according to the first embodiment (see FIG. 1) and will not be illustrated or described.

In the fifth embodiment, description will be given of the second bias circuit 4 that provides a bias to the base of the transistor Q2.

First Example Circuit Configuration

Figure 29:
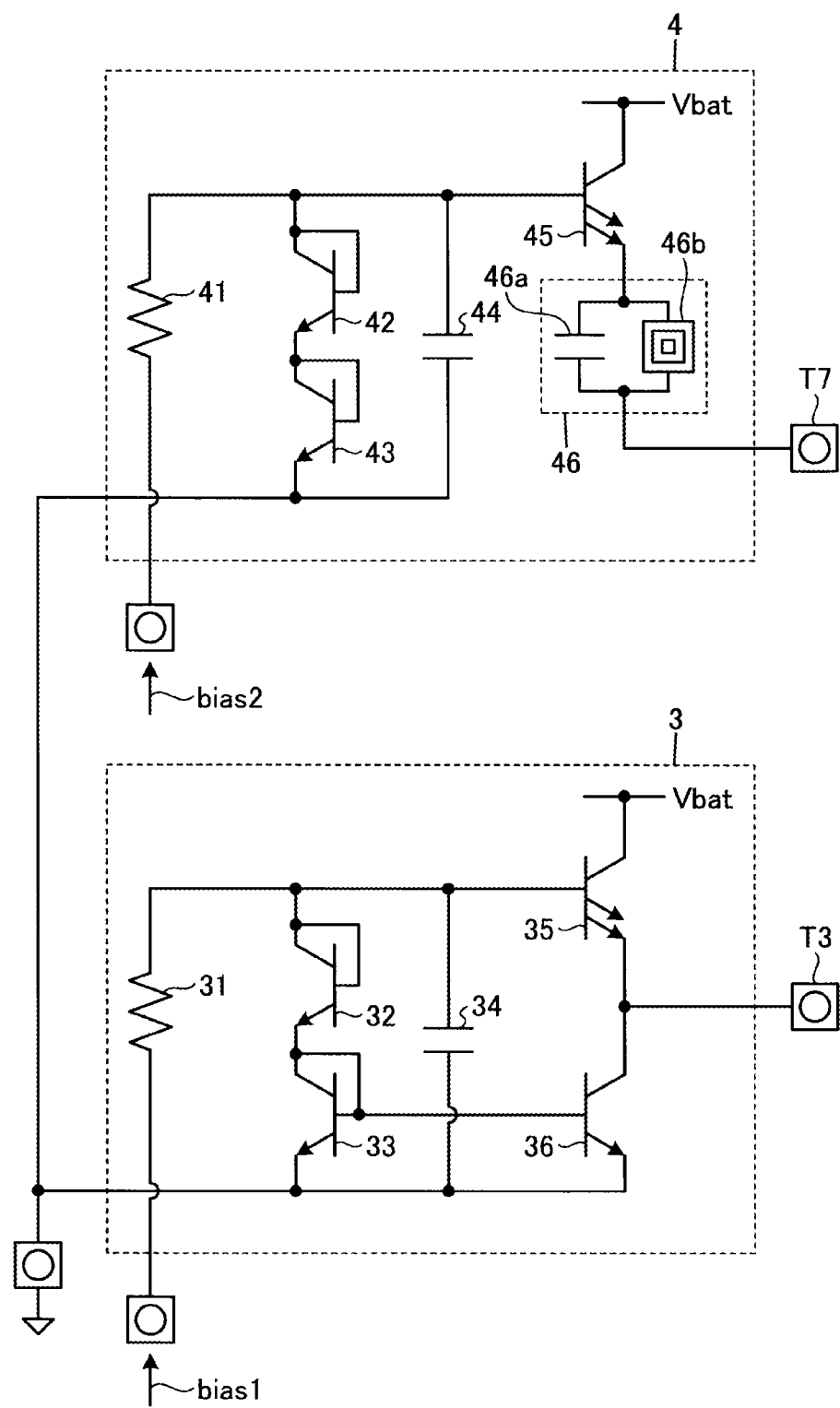
FIG. 29 illustrates a first example circuit configuration of a bias circuit according to a fifth embodiment.

FIG. 29 illustrates a first example circuit configuration of a bias circuit according to the fifth embodiment.

The first bias circuit 3 includes a resistor 31, transistors 32, 33, 35, and 36, and a capacitor 34.

A constant bias current (or bias voltage) bias1 is input to a first end of the resistor 31. A second end of the resistor 31 is electrically connected to the collector and base of the transistor 32.

The collector and base of the transistor 32 are electrically connected to each other. That is, the transistor 32 is diode-connected. The emitter of the transistor 32 is electrically connected to the collector and base of the transistor 33.

The collector and base of the transistor 33 are electrically connected to each other. That is, the transistor 33 is diode-connected. The emitter of the transistor 33 is electrically connected to a reference potential.

A first end of the capacitor 34 is electrically connected to the collector and base of the transistor 32. A second end of the capacitor 34 is electrically connected to the reference potential. The capacitor 34 stabilizes the voltages of the transistors 32 and 33, that is, the voltage of two diodes.

The collector of the transistor 35 is electrically connected to a power supply potential Vbat. The base of the transistor 35 is electrically connected to the first end of the capacitor 34. A constant bias current or bias voltage is input to the base of the transistor 35. The emitter of the transistor 35 is electrically connected to the collector of the transistor 36 and to the terminal T3.

The power supply potential Vbat corresponds to a "second power supply potential" of the present disclosure.

The collector of the transistor 36 is electrically connected to the emitter of the transistor 35 and to the terminal T3. The base of the transistor 36 is electrically connected to the base and collector of the transistor 33. The emitter of the transistor 36 is electrically connected to the reference potential. That is, the transistor 36 and the transistor 33 are connected in a current mirror configuration.

A bias current or voltage is output to the first power amplifier 10 from the emitter of the transistor 35 and the collector of the transistor 36 via the terminal T3.

The second bias circuit 4 includes a resistor 41, transistors 42, 43, and 45, a capacitor 44, and a tank circuit (LC parallel circuit) 46.

A constant bias current (or bias voltage) bias2 is input to a first end of the resistor 41. A second end of the resistor 41 is electrically connected to the collector and base of the transistor 42.

The collector and base of the transistor 42 are electrically connected to each other. That is, the transistor 42 is diode-connected. The emitter of the transistor 42 is electrically connected to the collector and base of the transistor 43.

The collector and base of the transistor 43 are electrically connected to each other. That is, the transistor 43 is diode-connected. The emitter of the transistor 43 is electrically connected to the reference potential. Each of the transistor 42 and the transistor 43 may be replaced by a diode. In this case, the second end of the resistor 41 is connected to the anode of one diode, and the cathode thereof is connected to the anode of the other diode whose cathode is connected to the reference potential.

A first end of the capacitor 44 is electrically connected to the collector and base of the transistor 42. A second end of the capacitor 44 is electrically connected to the reference potential. The capacitor 44 stabilizes the voltages of the transistors 42 and 43, that is, the voltage of two diodes.

The collector of the transistor 45 is electrically connected to the power supply potential Vbat. The base of the transistor 45 is electrically connected to the first end of the capacitor 44. A constant bias current or bias voltage is input to the base of the transistor 45. The emitter of the transistor 45 is electrically connected to a first end of the tank circuit 46.

The transistor 45 corresponds to a "third transistor" of the present disclosure. The bias current or voltage input to the base of the transistor 45 corresponds to a "third bias current or voltage" of the present disclosure.

The tank circuit 46 includes a capacitor 46a and an inductor 46b that are connected in parallel with each other. The tank circuit 46 has a function of a band elimination filter whose impedance is infinite at the resonant frequency.

The capacitor 46a corresponds to a "third capacitor" of the present disclosure. The inductor 46b corresponds to a "fourth inductor" of the present disclosure.

A bias current or voltage is output to the second power amplifier 20 from a second end of the tank circuit 46 via the terminal T7.

It is desirable to design the circuit configuration or circuit constants of the second bias circuit 4 so as to achieve a desired trade-off between the output power and power-added efficiency of the power amplifier 2. The circuit configuration or circuit constants of the first bias circuit 3 are not limited to any specific implementation. The circuit configuration or circuit constants of the first bias circuit 3 may be the same as or different from the circuit configuration or circuit constants of the second bias circuit 4.

The second bias circuit 4 is electrically connected to the base of the transistor Q2 via the resistor Rbb2 (see FIG. 1). Changing the circuit configuration or circuit constants of the second bias circuit 4 can adjust the base impedance of the transistor Q2. Accordingly, as in the second to fourth embodiments, the collector impedance ZL_Q1 of the transistor Q1 can be adjusted.

Figure 30:
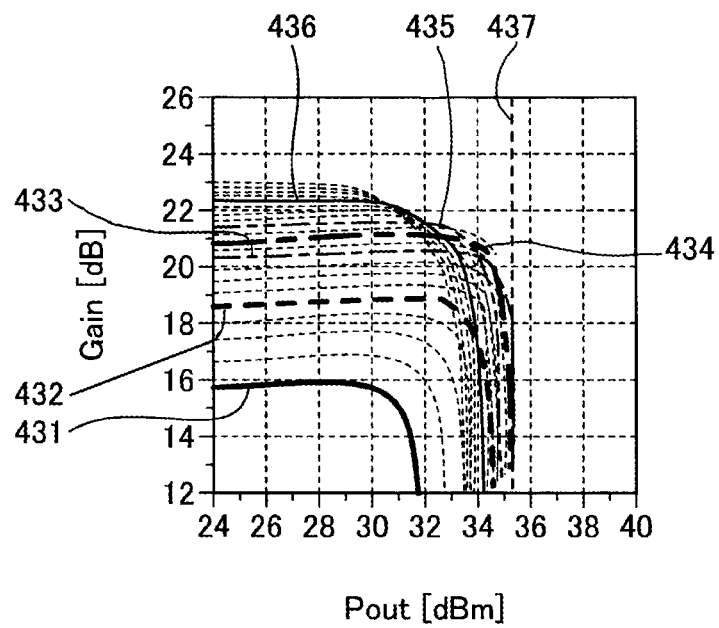
FIG. 30 illustrates circuit simulation results of the first example circuit configuration according to the fifth embodiment.
Figure 31:
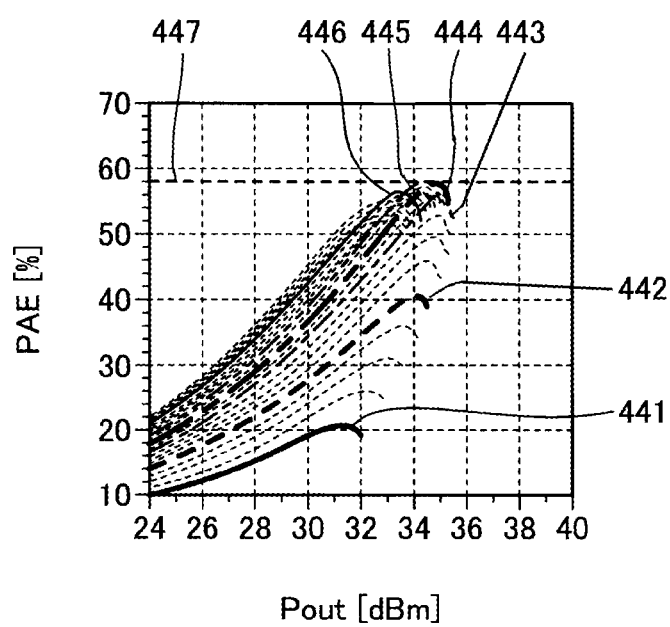
FIG. 31 illustrates circuit simulation results of the first example circuit configuration according to the fifth embodiment.
Figure 32:
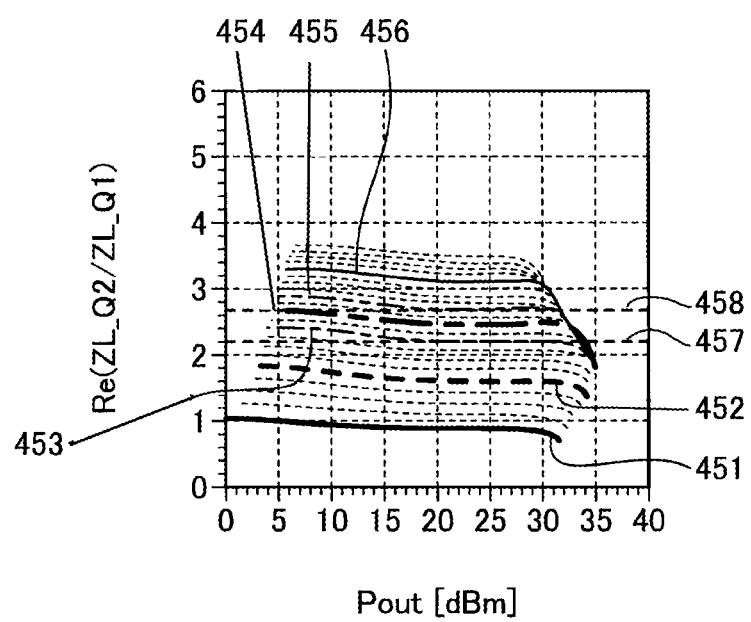
FIG. 32 illustrates circuit simulation results of the first example circuit configuration according to the fifth embodiment.

FIGS. 30 to 32 illustrate circuit simulation results of the first example circuit configuration according to the fifth embodiment.

FIG. 30 illustrates a relationship between the signal strength (dBm) of the RF output signal Pout and the gain (dB) of the power amplifier 2.

Line 431 represents the locus of the gain of the power amplifier 2 when the collector impedance ZL_Q2 of the transistor Q2 was set to 2Ω. Line 432 represents the locus of the gain of the power amplifier 2 when the collector impedance ZL_Q2 of the transistor Q2 was set to 4Ω. Line 433 represents the locus of the gain of the power amplifier 2 when the collector impedance ZL_Q2 of the transistor Q2 was set to 6Ω.

Line 434 represents the locus of the gain of the power amplifier 2 when the collector impedance ZL_Q2 of the transistor Q2 was set to 7Ω. Line 435 represents the locus of the gain of the power amplifier 2 when the collector impedance ZL_Q2 of the transistor Q2 was set to 8Ω. Line 436 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 7Ω ((7±α) Ω), thereby obtaining high gain. It is indicated that, for example, the collector impedance ZL_Q2 of the transistor Q2 is set to 7Ω, thereby obtaining gain with respect to the signal strength of the RF output signal Pout up to about 35.2 dBm, which is indicated by line 437.

FIG. 31 illustrates a relationship between the signal strength (dBm) of the RF output signal Pout and the power-added efficiency (%) of the power amplifier 2.

Line 441 represents the locus of the power-added efficiency of the power amplifier 2 when the collector impedance ZL_Q2 of the transistor Q2 was set to 2Ω. Line 442 represents the locus of the power-added efficiency of the power amplifier 2 when the collector impedance ZL_Q2 of the transistor Q2 was set to 4Ω. Line 443 represents the locus of the power-added efficiency of the power amplifier 2 when the collector impedance ZL_Q2 of the transistor Q2 was set to 6Ω.

Line 444 represents the locus of the power-added efficiency of the power amplifier 2 when the collector impedance ZL_Q2 of the transistor Q2 was set to 7Ω. Line 445 represents the locus of the power-added efficiency of the power amplifier 2 when the collector impedance ZL_Q2 of the transistor Q2 was set to 8Ω. Line 446 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 7Ω ((7±α) Ω), thereby obtaining high power-added efficiency. It is indicated that, for example, the collector impedance ZL_Q2 of the transistor Q2 is set to 7Ω, thereby obtaining a power-added efficiency of about 58%, which is indicated by line 447.

FIG. 32 illustrates a relationship between the signal strength (dBm) of the RF output signal Pout and the impedance ratio.

Line 451 represents the locus of the impedance ratio when the collector impedance ZL_Q2 of the transistor Q2 was set to 2Ω. Line 452 represents the locus of the impedance ratio when the collector impedance ZL_Q2 of the transistor Q2 was set to 4Ω. Line 453 represents the locus of the impedance ratio when the collector impedance ZL_Q2 of the transistor Q2 was set to 6Ω.

Line 454 represents the locus of the impedance ratio when the collector impedance ZL_Q2 of the transistor Q2 was set to 7Ω. Line 455 represents the locus of the impedance ratio when the collector impedance ZL_Q2 of the transistor Q2 was set to 8Ω. Line 456 represents the locus of the impedance ratio when the collector impedance ZL_Q2 of the transistor Q2 was set to 10Ω.

FIGS. 30 and 31 indicate that setting the collector impedance ZL_Q2 of the transistor Q2 to about 7Ω ((7±α) Ω) can achieve a desired trade-off between the output power and power-added efficiency of the power amplifier 2. FIG. 32 indicates that the impedance ratio providing the desired trade-off ranges from about 2.2, which is indicated by line 457, to about 2.7, which is indicated by line 458.

In the power amplifier 2, therefore, setting the impedance ratio to be greater than or equal to about 2.2 and less than or equal to about 2.7 can achieve a desired trade-off between the output power and power-added efficiency of the power amplifier 2.

Second Example Circuit Configuration

Figure 33:
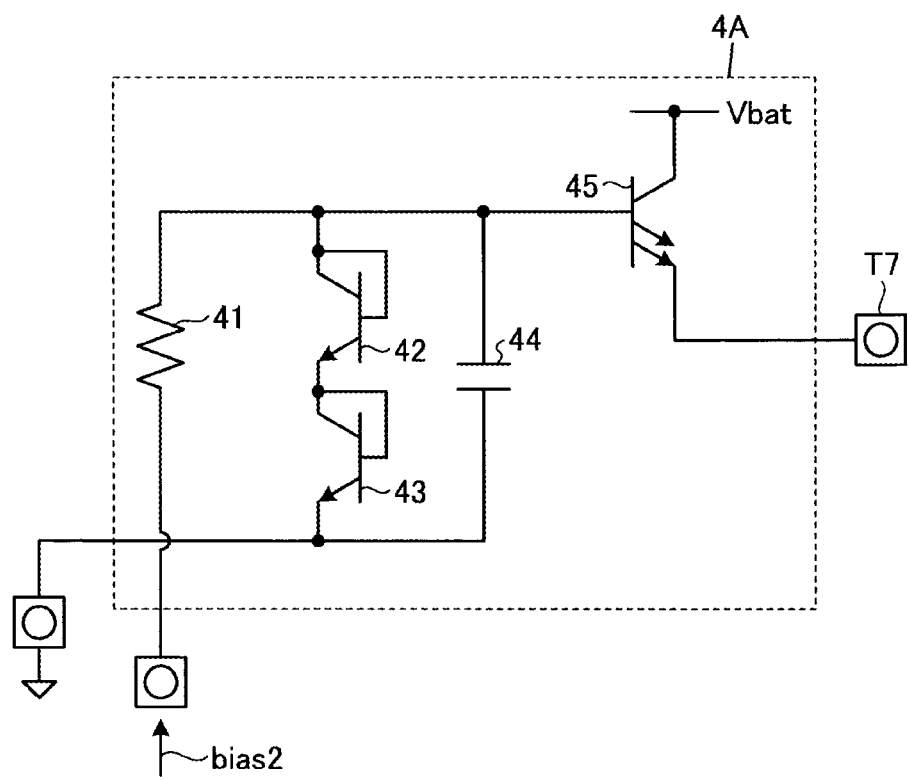
FIG. 33 illustrates a second example circuit configuration of the bias circuit according to the fifth embodiment.

FIG. 33 illustrates a second example circuit configuration of the bias circuit according to the fifth embodiment.

Compared to the second bias circuit 4 (see FIG. 29), a second bias circuit 4A does not include the tank circuit 46. The emitter of the transistor 45 is electrically connected to the resistor Rbb2 (see FIG. 1) via the terminal T7. That is, the transistor 45 is connected as an emitter follower. A bias current or voltage is output to the second power amplifier 20 from the emitter of the transistor 45 via the terminal T7.

FIGS. 34 to 40 illustrate circuit simulation results of the second example circuit configuration according to the fifth embodiment.

Figure 34:
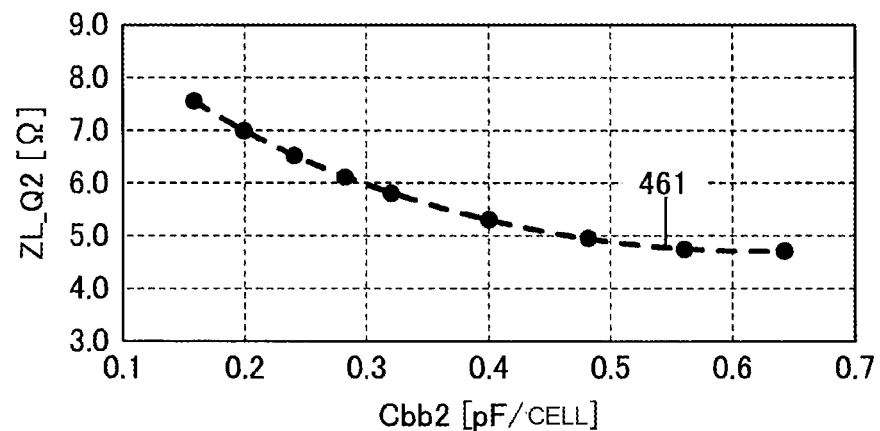
FIG. 34 illustrates circuit simulation results of the second example circuit configuration according to the fifth embodiment.
Figure 35:
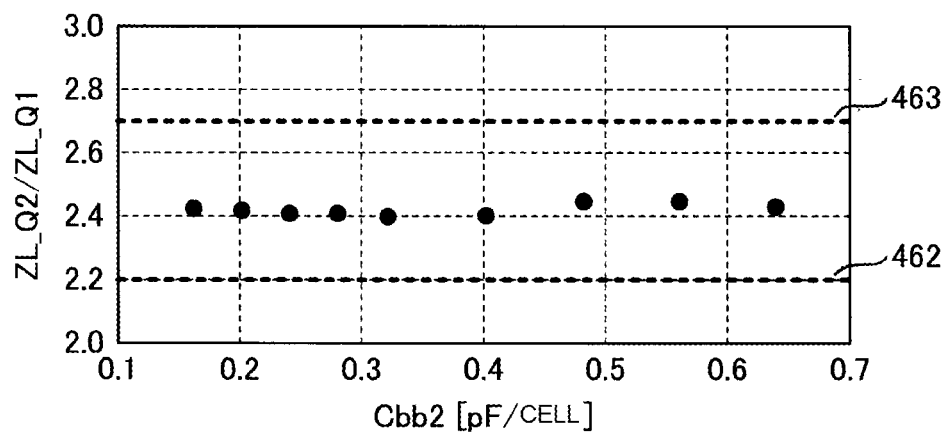
FIG. 35 illustrates circuit simulation results of the second example circuit configuration according to the fifth embodiment.

FIG. 34 illustrates a relationship between the electrostatic capacity value of the capacitor Cbb2 and the collector impedance ZL_Q2 of the transistor Q2 that provides a desired trade-off between the output power and power-added efficiency of the power amplifier 2. FIG. 35 illustrates a relationship between the electrostatic capacity value of the capacitor Cbb2 and the impedance ratio for the collector impedance ZL_Q2 of the transistor Q2 that provides a desired trade-off between the output power and power-added efficiency of the power amplifier 2.

In FIGS. 34 and 35, the electrostatic capacity value of the capacitor Cbb2 was changed from about 0.15 pF/cell to about 0.65 pF/cell.

As indicated by line 461 in FIG. 34, the collector impedance ZL_Q2 of the transistor Q2 that provides a desired trade-off between the output power and power-added efficiency of the power amplifier 2 changes about 7.8Ω to about 4.5Ω.

As illustrated in FIG. 35, the impedance ratio for the collector impedance ZL_Q2 of the transistor Q2 that provides a desired trade-off between the output power and power-added efficiency of the power amplifier 2 falls within a range from about 2.2, which is indicated by line 462, to about 2.7, which is indicated by line 463.

Figure 36:
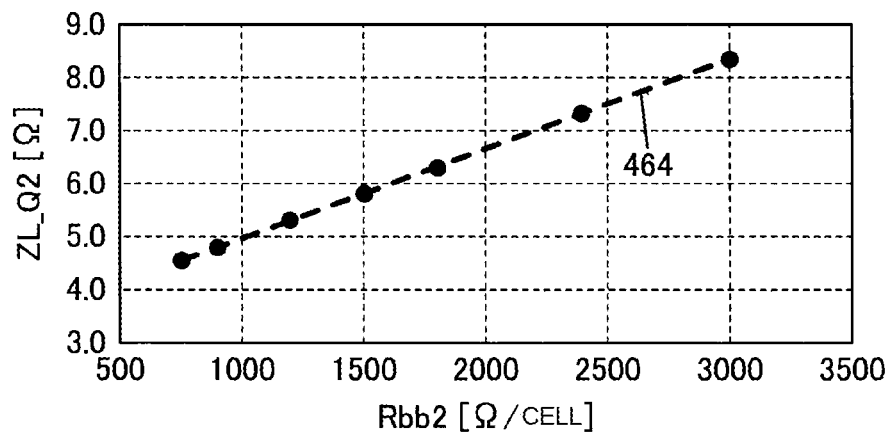
FIG. 36 illustrates circuit simulation results of the second example circuit configuration according to the fifth embodiment.
Figure 37:
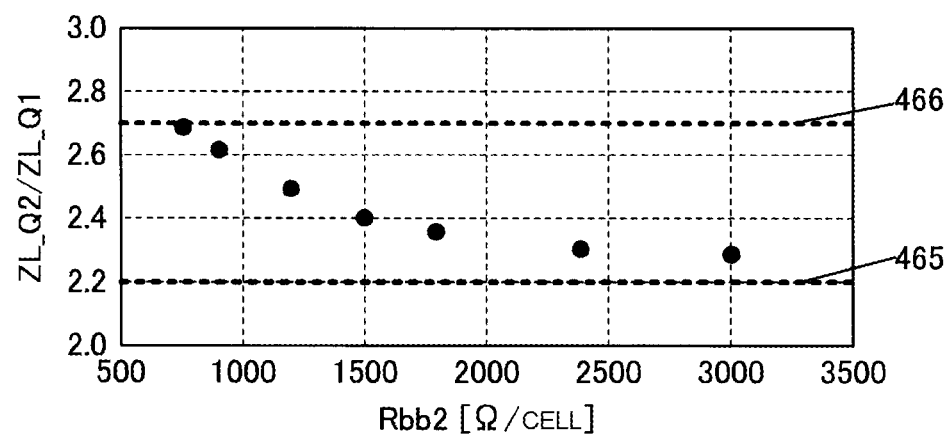
FIG. 37 illustrates circuit simulation results of the second example circuit configuration according to the fifth embodiment.

FIG. 36 illustrates a relationship between the resistance value of the resistor Rbb2 and the collector impedance ZL_Q2 of the transistor Q2 that provides a desired trade-off between the output power and power-added efficiency of the power amplifier 2. FIG. 37 illustrates a relationship between the resistance value of the resistor Rbb2 and the impedance ratio for the collector impedance ZL_Q2 of the transistor Q2 that provides a desired trade-off between the output power and power-added efficiency of the power amplifier 2.

In FIGS. 36 and 37, the resistance value of the resistor Rbb2 was changed from about 750 Ω/cell to about 3000 Ω/cell.

As indicated by line 464 in FIG. 36, the collector impedance ZL_Q2 of the transistor Q2 that provides a desired trade-off between the output power and power-added efficiency of the power amplifier 2 changes from about 4.5Ω to about 8.2Ω.

As illustrated in FIG. 37, the impedance ratio for the collector impedance ZL_Q2 of the transistor Q2 that provides a desired trade-off between the output power and power-added efficiency of the power amplifier 2 falls within a range from about 2.2, which is indicated by line 465, to about 2.7, which is indicated by line 466.

Figure 38:
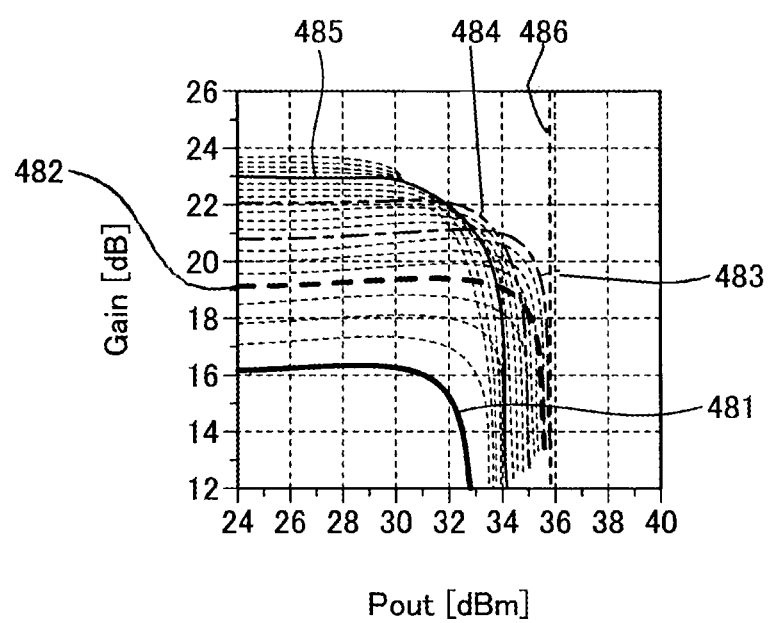
FIG. 38 illustrates circuit simulation results of the second example circuit configuration according to the fifth embodiment.

FIG. 38 illustrates a relationship between the signal strength (dBm) of the RF output signal Pout and the gain (dB) of the power amplifier 2 when the electrostatic capacity value of the capacitor Cbb2 was 0.32 pF/cell and the resistance value of the resistor Rbb2 was 1500 Ω/cell.

Line 481 represents the locus of the gain of the power amplifier 2 when the collector impedance ZL_Q2 of the transistor Q2 was set to 2Ω. Line 482 represents the locus of the gain of the power amplifier 2 when the collector impedance ZL_Q2 of the transistor Q2 was set to 4Ω. Line 483 represents the locus of the gain of the power amplifier 2 when the collector impedance ZL_Q2 of the transistor Q2 was set to 6Ω.

Line 484 represents the locus of the gain of the power amplifier 2 when the collector impedance ZL_Q2 of the transistor Q2 was set to 8Ω. Line 485 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 6Ω ((6±α) Ω), thereby obtaining high gain. It is indicated that, for example, the collector impedance ZL_Q2 of the transistor Q2 is set to 6Ω, thereby obtaining gain with respect to the signal strength of the RF output signal Pout up to about 35.6 dBm, which is indicated by line 486.

Figure 39:
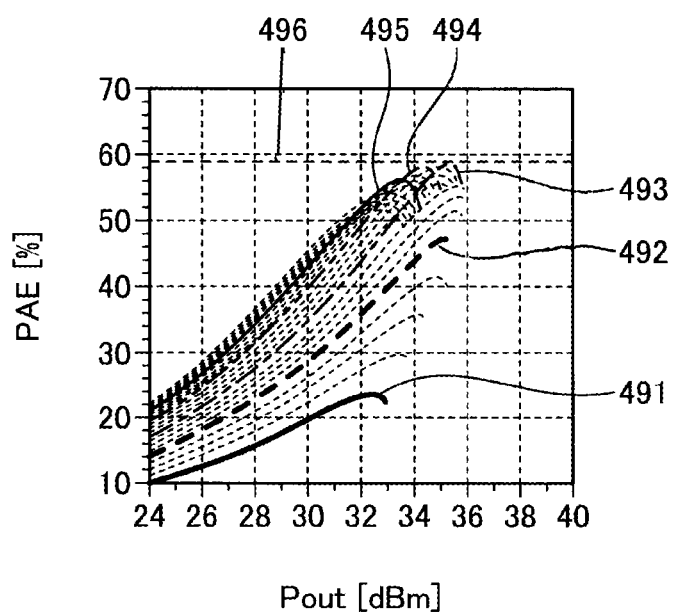
FIG. 39 illustrates circuit simulation results of the second example circuit configuration according to the fifth embodiment.

FIG. 39 illustrates a relationship between the signal strength (dBm) of the RF output signal Pout and the power-added efficiency (%) of the power amplifier 2 when the electrostatic capacity value of the capacitor Cbb2 was 0.32 pF/cell and the resistance value of the resistor Rbb2 was 1500 Ω/cell.

Line 491 represents the locus of the power-added efficiency of the power amplifier 2 when the collector impedance ZL_Q2 of the transistor Q2 was set to 2Ω. Line 492 represents the locus of the power-added efficiency of the power amplifier 2 when the collector impedance ZL_Q2 of the transistor Q2 was set to 4Ω. Line 493 represents the locus of the power-added efficiency of the power amplifier 2 when the collector impedance ZL_Q2 of the transistor Q2 was set to 6Ω.

Line 494 represents the locus of the power-added efficiency of the power amplifier 2 when the collector impedance ZL_Q2 of the transistor Q2 was set to 8Ω. Line 495 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 6Ω ((6±α) Ω), thereby obtaining high power-added efficiency. It is indicated that, for example, the collector impedance ZL_Q2 of the transistor Q2 is set to 6Ω, thereby obtaining a power-added efficiency of about 59%, which is indicated by line 496.

Figure 40:
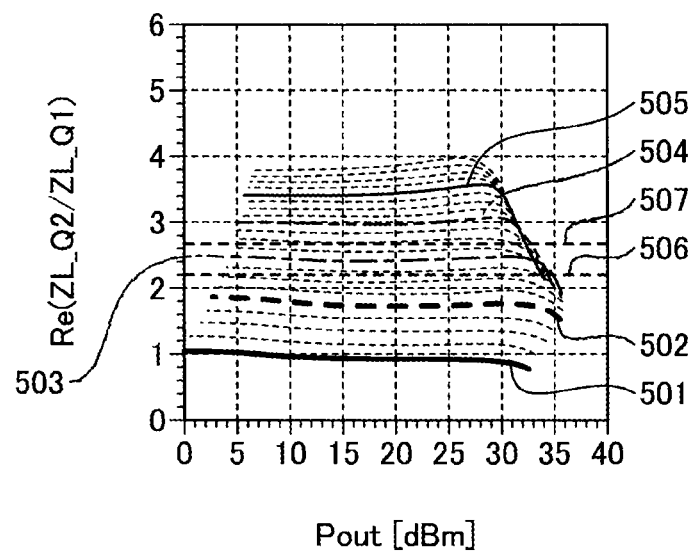
FIG. 40 illustrates circuit simulation results of the second example circuit configuration according to the fifth embodiment.

FIG. 40 illustrates a relationship between the signal strength (dBm) of the RF output signal Pout and the impedance ratio when the electrostatic capacity value of the capacitor Cbb2 was 0.32 pF/cell and the resistance value of the resistor Rbb2 was 1500 Ω/cell.

Line 501 represents the locus of the impedance ratio when the collector impedance ZL_Q2 of the transistor Q2 was set to 2 Ω. Line 502 represents the locus of the impedance ratio when the collector impedance ZL_Q2 of the transistor Q2 was set to 4Ω. Line 503 represents the locus of the impedance ratio when the collector impedance ZL_Q2 of the transistor Q2 was set to 6Ω.

Line 504 represents the locus of the impedance ratio when the collector impedance ZL_Q2 of the transistor Q2 was set to 8Ω. Line 505 represents the locus of the impedance ratio when the collector impedance ZL_Q2 of the transistor Q2 was set to 10Ω.

FIGS. 38 and 39 indicate that setting the collector impedance ZL_Q2 of the transistor Q2 to about 6Ω ((6±α) Ω) can achieve a desired trade-off between the output power and power-added efficiency of the power amplifier 2. FIG. 40 indicates that the impedance ratio providing the desired trade-off ranges from about 2.2, which is indicated by line 506, to about 2.7, which is indicated by line 507.

In the power amplifier 2, therefore, setting the impedance ratio to be greater than or equal to about 2.2 and less than or equal to about 2.7 can achieve a desired trade-off between the output power and power-added efficiency of the power amplifier 2.

Third Example Circuit Configuration

Figure 41:
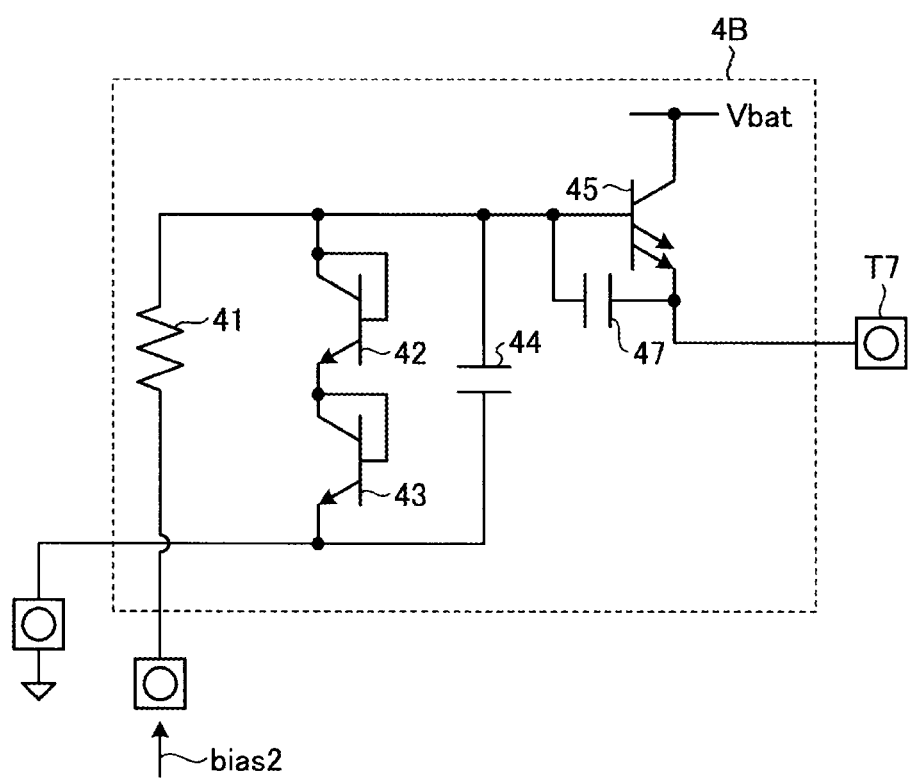
FIG. 41 illustrates a third example circuit configuration of the bias circuit according to the fifth embodiment.

FIG. 41 illustrates a third example circuit configuration of the bias circuit according to the fifth embodiment.

Compared to the second bias circuit 4A (see FIG. 33), a second bias circuit 4B further includes a capacitor 47. A first end of the capacitor 47 is electrically connected to the base of the transistor 45. A second end of the capacitor 47 is electrically connected to the emitter of the transistor 45. That is, the capacitor 47 operates as an emitter-to-base feedback capacitor for the transistor 45. The capacitor 47 provides a path to bypass an RF signal that flows via the terminal T7 to prevent an increase in average bias current or voltage.

The capacitor 47 corresponds to a "fourth capacitor" of the present disclosure.

Figure 42:
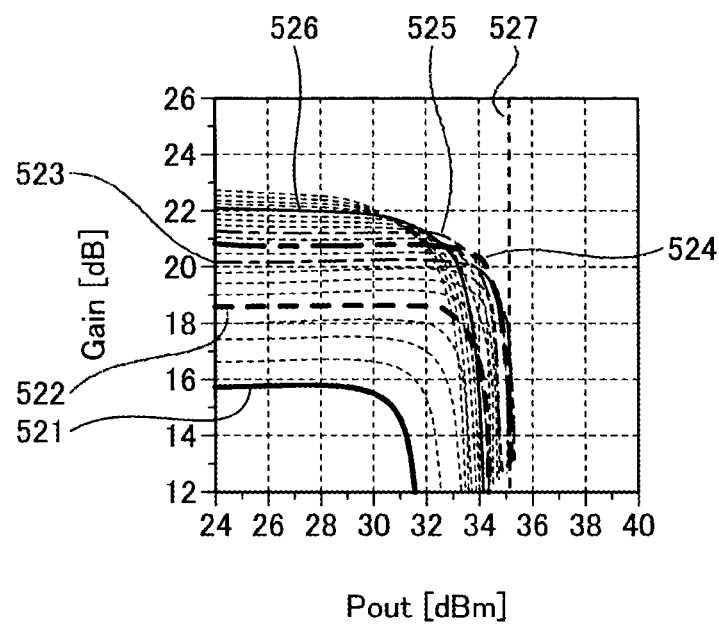
FIG. 42 illustrates circuit simulation results of the third example circuit configuration according to the fifth embodiment.
Figure 43:
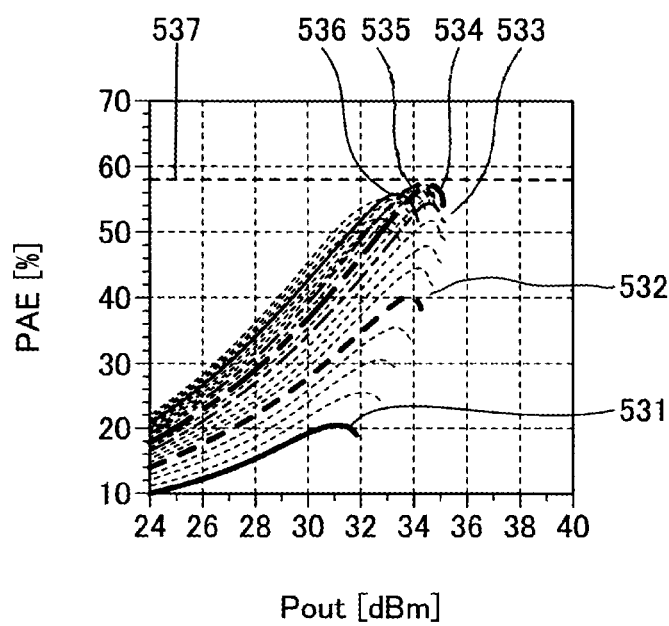
FIG. 43 illustrates circuit simulation results of the third example circuit configuration according to the fifth embodiment.
Figure 44:
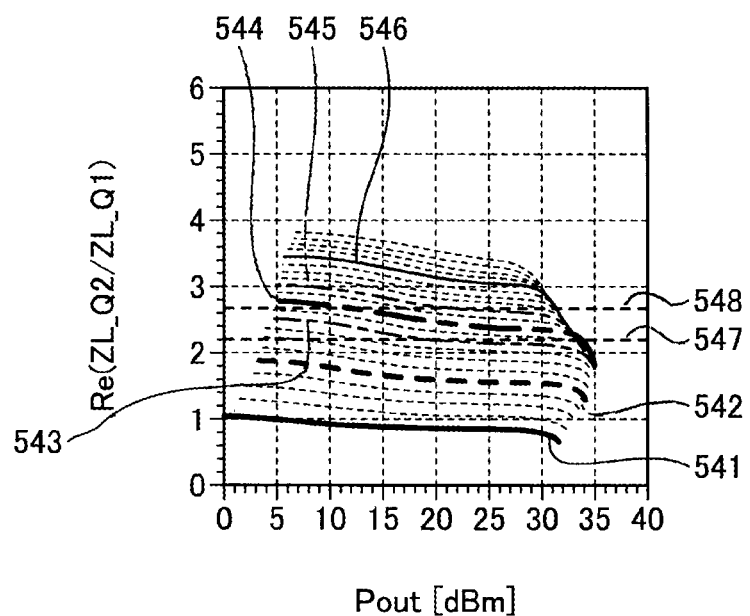
FIG. 44 illustrates circuit simulation results of the third example circuit configuration according to the fifth embodiment.

FIGS. 42 to 44 illustrate circuit simulation results of the third example circuit configuration according to the fifth embodiment.

FIG. 42 illustrates a relationship between the signal strength (dBm) of the RF output signal Pout and the gain (dB) of the power amplifier 2.

Line 521 represents the locus of the gain of the power amplifier 2 when the collector impedance ZL_Q2 of the transistor Q2 was set to 2Ω. Line 522 represents the locus of the gain of the power amplifier 2 when the collector impedance ZL_Q2 of the transistor Q2 was set to 4Ω. Line 523 represents the locus of the gain of the power amplifier 2 when the collector impedance ZL_Q2 of the transistor Q2 was set to 6Ω.

Line 524 represents the locus of the gain of the power amplifier 2 when the collector impedance ZL_Q2 of the transistor Q2 was set to 7Ω. Line 525 represents the locus of the gain of the power amplifier 2 when the collector impedance ZL_Q2 of the transistor Q2 was set to 8Ω. Line 526 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 7Ω to about 8Ω, thereby obtaining high gain. It is indicated that, for example, the collector impedance ZL_Q2 of the transistor Q2 is set to 7Ω or 8Ω, thereby obtaining gain with respect to the signal strength of the RF output signal Pout up to about 35.0 dBm, which is indicated by line 527.

FIG. 43 illustrates a relationship between the signal strength (dBm) of the RF output signal Pout and the power-added efficiency (%) of the power amplifier 2.

Line 531 represents the locus of the power-added efficiency of the power amplifier 2 when the collector impedance ZL_Q2 of the transistor Q2 was set to 2Ω. Line 532 represents the locus of the power-added efficiency of the power amplifier 2 when the collector impedance ZL_Q2 of the transistor Q2 was set to 4Ω. Line 533 represents the locus of the power-added efficiency of the power amplifier 2 when the collector impedance ZL_Q2 of the transistor Q2 was set to 6Ω.

Line 534 represents the locus of the power-added efficiency of the power amplifier 2 when the collector impedance ZL_Q2 of the transistor Q2 was set to 7Ω. Line 535 represents the locus of the power-added efficiency of the power amplifier 2 when the collector impedance ZL_Q2 of the transistor Q2 was set to 8Ω. Line 536 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 7Ω to about 8Ω, thereby obtaining high power-added efficiency. It is indicated that, for example, the collector impedance ZL_Q2 of the transistor Q2 is set to 7Ω or 8Ω, thereby obtaining a power-added efficiency of about 58%, which is indicated by line 537.

FIG. 44 illustrates a relationship between the signal strength (dBm) of the RF output signal Pout and the impedance ratio.

Line 541 represents the locus of the impedance ratio when the collector impedance ZL_Q2 of the transistor Q2 was set to 2Ω. Line 542 represents the locus of the impedance ratio when the collector impedance ZL_Q2 of the transistor Q2 was set to 4Ω. Line 543 represents the locus of the impedance ratio when the collector impedance ZL_Q2 of the transistor Q2 was set to 6Ω.

Line 544 represents the locus of the impedance ratio when the collector impedance ZL_Q2 of the transistor Q2 was set to 7Ω. Line 545 represents the locus of the impedance ratio when the collector impedance ZL_Q2 of the transistor Q2 was set to 8Ω. Line 546 represents the locus of the impedance ratio when the collector impedance ZL_Q2 of the transistor Q2 was set to 10Ω.

FIGS. 42 and 43 indicate that setting the collector impedance ZL_Q2 of the transistor Q2 to about 7Ω to about 8Ω can achieve a desired trade-off between the output power and power-added efficiency of the power amplifier 2. FIG. 44 indicates that the impedance ratio providing the desired trade-off ranges from about 2.2, which is indicated by line 547, to about 2.7, which is indicated by line 548.

In the power amplifier 2, therefore, setting the impedance ratio to be greater than or equal to about 2.2 and less than or equal to about 2.7 can achieve a desired trade-off between the output power and power-added efficiency of the power amplifier 2.

Fourth Example Circuit Configuration

Figure 45:
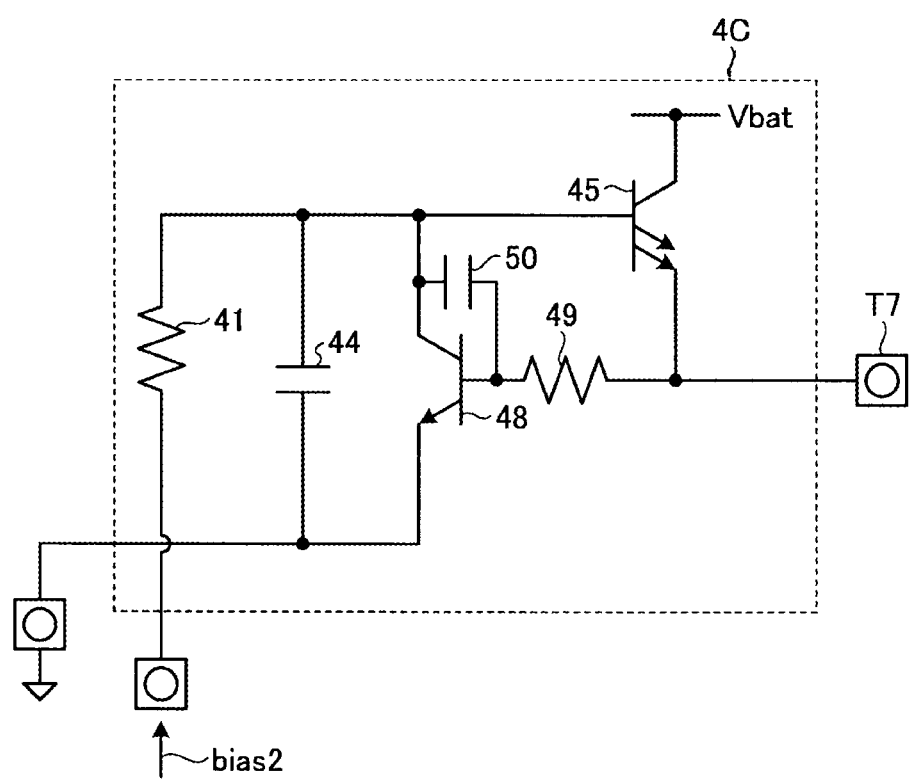
FIG. 45 illustrates a fourth example circuit configuration of the bias circuit according to the fifth embodiment.

FIG. 45 illustrates a fourth example circuit configuration of the bias circuit according to the fifth embodiment.

Compared to the second bias circuit 4A (see FIG. 33), a second bias circuit 4C does not include the transistor 42 or 43. The second bias circuit 4C further includes a transistor 48, a resistor 49, and a capacitor 50.

The emitter of the transistor 48 is electrically connected to the reference potential. The base of the transistor 48 is electrically connected to a first end of the resistor 49. A second end of the resistor 49 is electrically connected to the emitter of the transistor 45. The collector of the transistor 48 is electrically connected to the base of the transistor 45. The transistor 45 and the transistor 48 are Darlington connected. A first end of the capacitor 50 is electrically connected to the base of the transistor 48. A second end of the capacitor 50 is electrically connected to the collector of the transistor 48. The capacitor 50 stabilizes the potential of the base of the transistor 48 and the potential of the emitter of the transistor 45.

The transistor 48 corresponds to a "fourth transistor" of the present disclosure.

Figure 46:
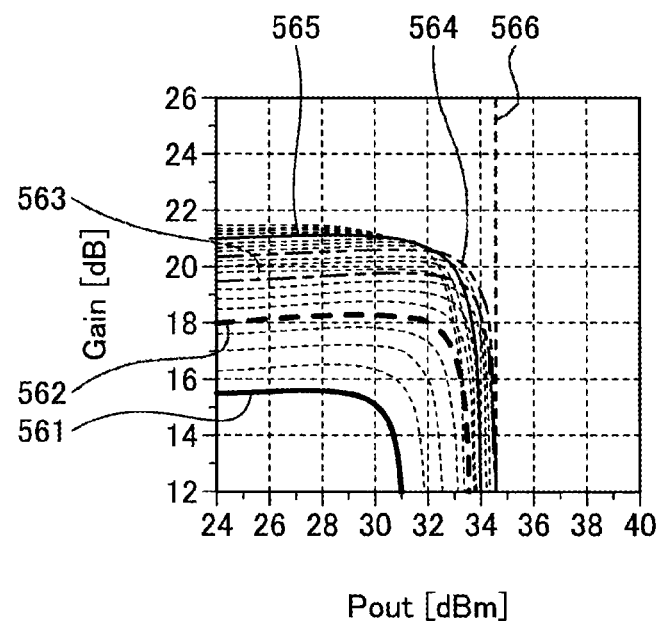
FIG. 46 illustrates circuit simulation results of the fourth example circuit configuration according to the fifth embodiment.
Figure 47:
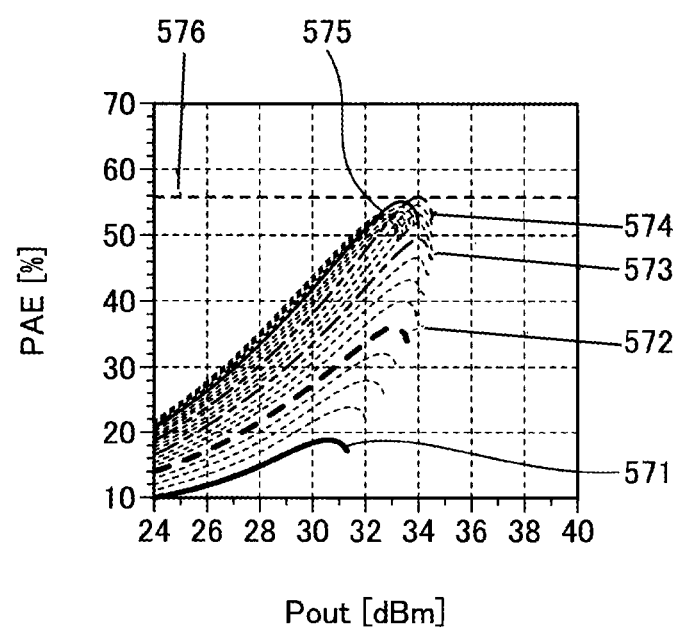
FIG. 47 illustrates circuit simulation results of the fourth example circuit configuration according to the fifth embodiment.
Figure 48:
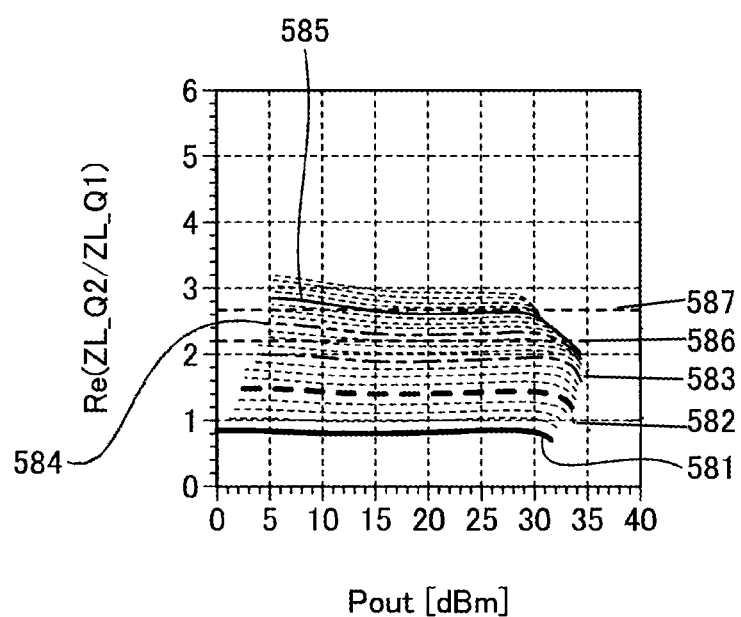
FIG. 48 illustrates circuit simulation results of the fourth example circuit configuration according to the fifth embodiment.

FIGS. 46 to 48 illustrate circuit simulation results of the fourth example circuit configuration according to the fifth embodiment.

FIG. 46 illustrates a relationship between the signal strength (dBm) of the RF output signal Pout and the gain (dB) of the power amplifier 2.

Line 561 represents the locus of the gain of the power amplifier 2 when the collector impedance ZL_Q2 of the transistor Q2 was set to 2Ω. Line 562 represents the locus of the gain of the power amplifier 2 when the collector impedance ZL_Q2 of the transistor Q2 was set to 4Ω. Line 563 represents the locus of the gain of the power amplifier 2 when the collector impedance ZL_Q2 of the transistor Q2 was set to 6Ω.

Line 564 represents the locus of the gain of the power amplifier 2 when the collector impedance ZL_Q2 of the transistor Q2 was set to 8Ω. Line 565 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 8Ω ((8±α) Ω), thereby obtaining high gain. It is indicated that, for example, the collector impedance ZL_Q2 of the transistor Q2 is set to 8Ω, thereby obtaining gain with respect to the signal strength of the RF output signal Pout up to about 34.4 dBm, which is indicated by line 566.

FIG. 47 illustrates a relationship between the signal strength (dBm) of the RF output signal Pout and the power-added efficiency (%) of the power amplifier 2.

Line 571 represents the locus of the power-added efficiency of the power amplifier 2 when the collector impedance ZL_Q2 of the transistor Q2 was set to 2Ω. Line 572 represents the locus of the power-added efficiency of the power amplifier 2 when the collector impedance ZL_Q2 of the transistor Q2 was set to 4Ω. Line 573 represents the locus of the power-added efficiency of the power amplifier 2 when the collector impedance ZL_Q2 of the transistor Q2 was set to 6Ω.

Line 574 represents the locus of the power-added efficiency of the power amplifier 2 when the collector impedance ZL_Q2 of the transistor Q2 was set to 8Ω. Line 575 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 8Ω ((8±α) Ω), thereby obtaining high power-added efficiency. It is indicated that, for example, the collector impedance ZL_Q2 of the transistor Q2 is set to 8Ω, thereby obtaining a power-added efficiency of about 56%, which is indicated by line 576.

FIG. 48 illustrates a relationship between the signal strength (dBm) of the RF output signal Pout and the impedance ratio.

Line 581 represents the locus of the impedance ratio when the collector impedance ZL_Q2 of the transistor Q2 was set to 2Ω. Line 582 represents the locus of the impedance ratio when the collector impedance ZL_Q2 of the transistor Q2 was set to 4Ω. Line 583 represents the locus of the impedance ratio when the collector impedance ZL_Q2 of the transistor Q2 was set to 6Ω.

Line 584 represents the locus of the impedance ratio when the collector impedance ZL_Q2 of the transistor Q2 was set to 8Ω. Line 585 represents the locus of the impedance ratio when the collector impedance ZL_Q2 of the transistor Q2 was set to 10Ω.

FIGS. 46 and 47 indicate that setting the collector impedance ZL_Q2 of the transistor Q2 to about 8Ω ((8±α) Ω) can achieve a desired trade-off between the output power and power-added efficiency of the power amplifier 2. FIG. 48 indicates that the impedance ratio providing the desired trade-off ranges from about 2.2, which is indicated by line 586, to about 2.7, which is indicated by line 587.

In the power amplifier 2, therefore, setting the impedance ratio to be greater than or equal to about 2.2 and less than or equal to about 2.7 can achieve a desired trade-off between the output power and power-added efficiency of the power amplifier 2.

Fifth Example Circuit Configuration

Figure 49:
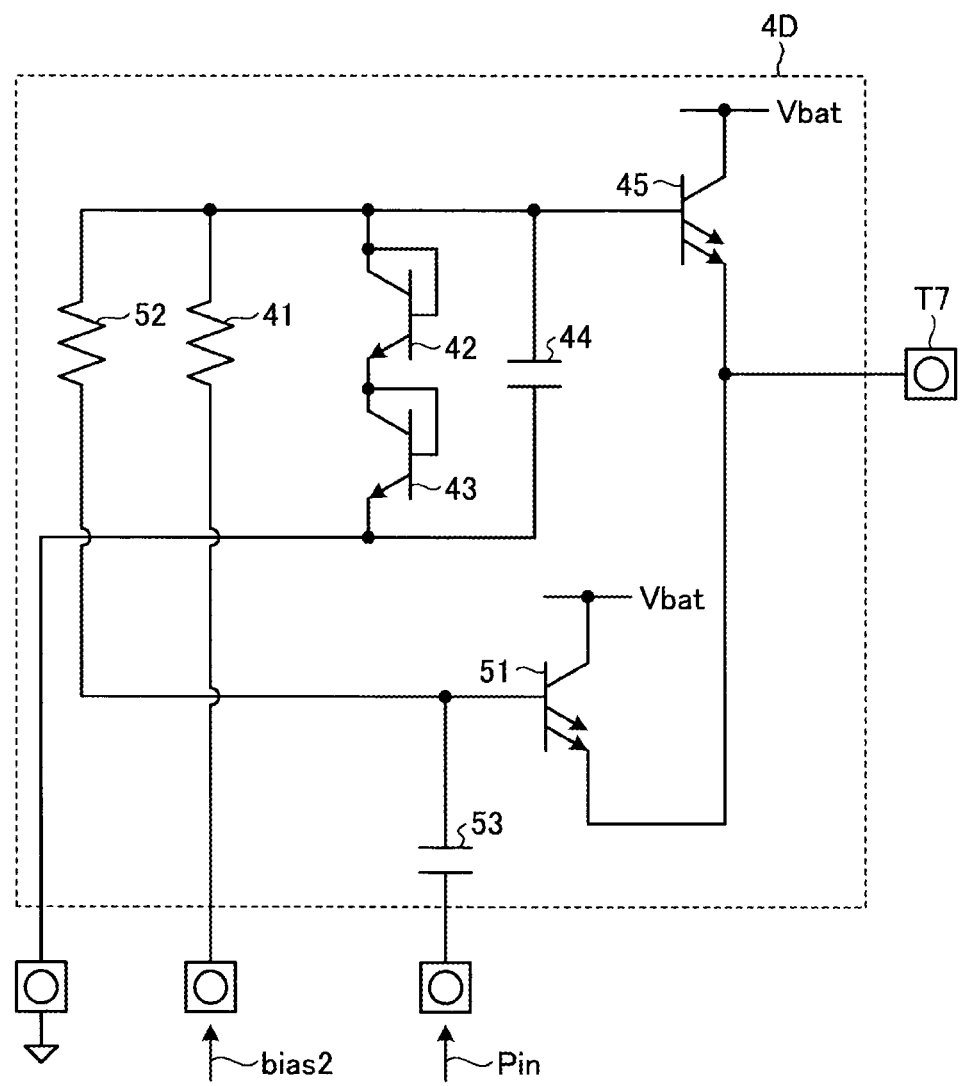
FIG. 49 illustrates a fifth example circuit configuration of the bias circuit according to the fifth embodiment.

FIG. 49 illustrates a fifth example circuit configuration of the bias circuit according to the fifth embodiment.

Compared to the second bias circuit 4A (see FIG. 33), a second bias circuit 4D further includes a transistor 51, a resistor 52, and a capacitor 53.

The collector of the transistor 51 is electrically connected to the power supply potential Vbat. The base of the transistor 51 is electrically connected to a first end of the resistor 52. A second end of the resistor 52 is electrically connected to the second end of the resistor 41. Accordingly, a constant bias current or voltage is input to the base of the transistor 51 via the resistor 52. The base of the transistor 51 is also electrically connected to a first end of the capacitor 53. The RF input signal Pin is input to a second end of the capacitor 53. The potential of the base of the transistor 51 increases or decreases in accordance with the RF input signal Pin. That is, the current or voltage output from the emitter of the transistor 51 increases or decreases in accordance with the RF input signal Pin. The emitter of the transistor 51 is electrically connected to the emitter of the transistor 45. A bias current or voltage is output to the second power amplifier 20 from the emitter of the transistor 45 and the emitter of the transistor 51. The second bias circuit 4D is an RF detector bias circuit.

The transistor 51 corresponds to a "fifth transistor" of the present disclosure. The bias current or voltage input to the base of the transistor 51 corresponds to a "fourth bias current or voltage" of the present disclosure.

Figure 50:
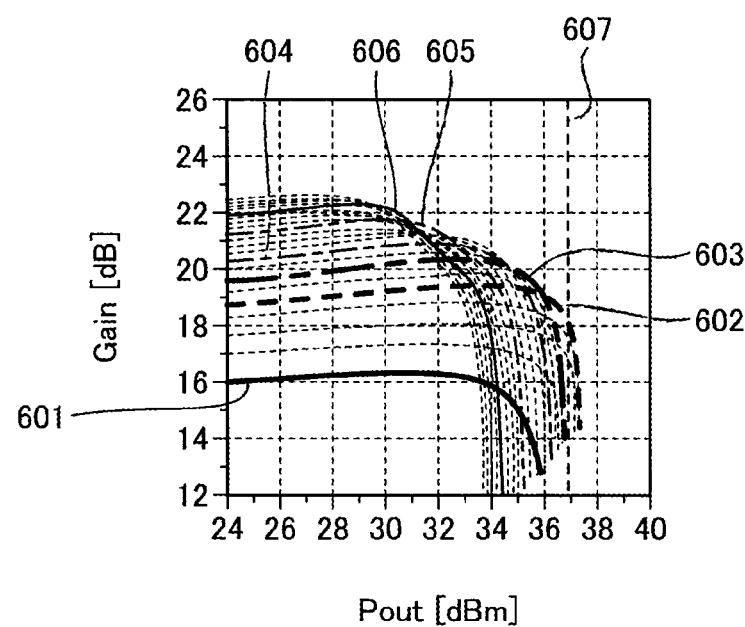
FIG. 50 illustrates circuit simulation results of the fifth example circuit configuration according to the fifth embodiment.
Figure 51:
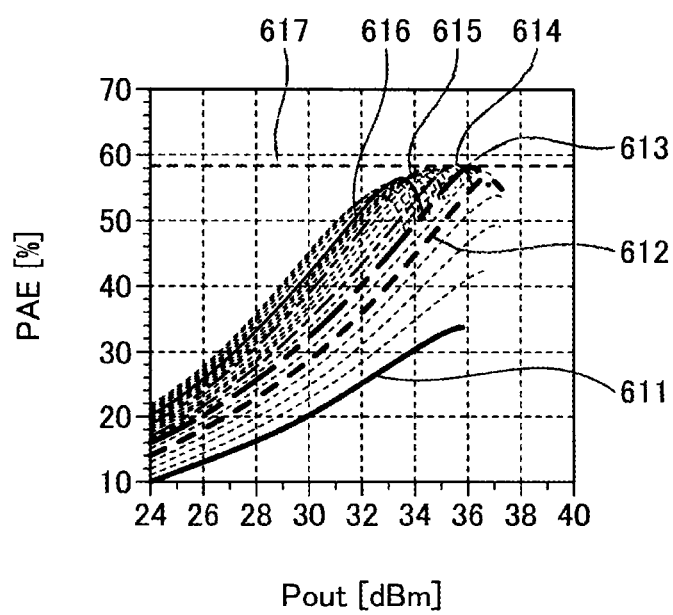
FIG. 51 illustrates circuit simulation results of the fifth example circuit configuration according to the fifth embodiment.
Figure 52:
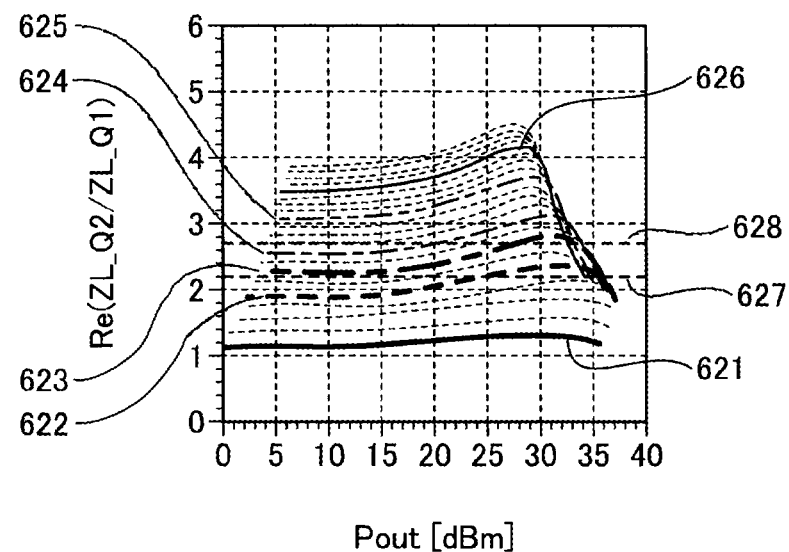
FIG. 52 illustrates circuit simulation results of the fifth example circuit configuration according to the fifth embodiment.

FIGS. 50 to 52 illustrate circuit simulation results of the fifth example circuit configuration according to the fifth embodiment.

FIG. 50 illustrates a relationship between the signal strength (dBm) of the RF output signal Pout and the gain (dB) of the power amplifier 2.

Line 601 represents the locus of the gain of the power amplifier 2 when the collector impedance ZL_Q2 of the transistor Q2 was set to 2Ω. Line 602 represents the locus of the gain of the power amplifier 2 when the collector impedance ZL_Q2 of the transistor Q2 was set to 4Ω. Line 603 represents the locus of the gain of the power amplifier 2 when the collector impedance ZL_Q2 of the transistor Q2 was set to 5Ω.

Line 604 represents the locus of the gain of the power amplifier 2 when the collector impedance ZL_Q2 of the transistor Q2 was set to 6Ω. Line 605 represents the locus of the gain of the power amplifier 2 when the collector impedance ZL_Q2 of the transistor Q2 was set to 8Ω. Line 606 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 5Ω ((5±α) Ω), thereby obtaining high gain. It is indicated that, for example, the collector impedance ZL_Q2 of the transistor Q2 is set to 5Ω, thereby obtaining gain with respect to the signal strength of the RF output signal Pout up to about 36.8 dBm, which is indicated by line 607.

FIG. 51 illustrates a relationship between the signal strength (dBm) of the RF output signal Pout and the power-added efficiency (%) of the power amplifier 2.

Line 611 represents the locus of the power-added efficiency of the power amplifier 2 when the collector impedance ZL_Q2 of the transistor Q2 was set to 2Ω. Line 612 represents the locus of the power-added efficiency of the power amplifier 2 when the collector impedance ZL_Q2 of the transistor Q2 was set to 4Ω. Line 613 represents the locus of the power-added efficiency of the power amplifier 2 when the collector impedance ZL_Q2 of the transistor Q2 was set to 5Ω.

Line 614 represents the locus of the power-added efficiency of the power amplifier 2 when the collector impedance ZL_Q2 of the transistor Q2 was set to 6Ω. Line 615 represents the locus of the power-added efficiency of the power amplifier 2 when the collector impedance ZL_Q2 of the transistor Q2 was set to 8Ω. Line 616 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 5Ω ((5±α) Ω), thereby obtaining high power-added efficiency. It is indicated that, for example, the collector impedance ZL_Q2 of the transistor Q2 is set to 5Ω, thereby obtaining a power-added efficiency of about 58%, which is indicated by line 617.

FIG. 52 illustrates a relationship between the signal strength (dBm) of the RF output signal Pout and the impedance ratio.

Line 621 represents the locus of the impedance ratio when the collector impedance ZL_Q2 of the transistor Q2 was set to 2Ω. Line 622 represents the locus of the impedance ratio when the collector impedance ZL_Q2 of the transistor Q2 was set to 4Ω. Line 623 represents the locus of the impedance ratio when the collector impedance ZL_Q2 of the transistor Q2 was set to 5Ω.

Line 624 represents the locus of the impedance ratio when the collector impedance ZL_Q2 of the transistor Q2 was set to 6Ω. Line 625 represents the locus of the impedance ratio when the collector impedance ZL_Q2 of the transistor Q2 was set to 8Ω. Line 626 represents the locus of the impedance ratio when the collector impedance ZL_Q2 of the transistor Q2 was set to 10Ω.

FIGS. 50 and 51 indicate that setting the collector impedance ZL_Q2 of the transistor Q2 to about 5Ω ((5±α) Ω) can achieve a desired trade-off between the output power and power-added efficiency of the power amplifier 2. FIG. 52 indicates that the impedance ratio providing the desired trade-off ranges from about 2.2, which is indicated by line 627, to about 2.7, which is indicated by line 628.

In the power amplifier 2, therefore, setting the impedance ratio to be greater than or equal to about 2.2 and less than or equal to about 2.7 can achieve a desired trade-off between the output power and power-added efficiency of the power amplifier 2.

Sixth Embodiment

A circuit configuration according to a sixth embodiment is similar to the circuit configuration according to the first embodiment (see FIG. 1) and will not be illustrated or described.

In the sixth embodiment, the inductance values of the first inductor L1 and the second inductor L2 are changed.

Originally, the first inductor L1 whose inductance value is set to a sufficiently large value serves to provide a choke function that isolates (blocks) the collector of the transistor Q1 from the power supply potential Vcc for AC and that couples (connects) the collector of the transistor Q1 to the power supply potential Vcc for DC. Likewise, the second inductor L2 whose inductance value is set to a sufficiently large value serves to provide a choke function that isolates the emitter of the transistor Q2 from the reference potential for AC and that couples the emitter of the transistor Q2 to the reference potential for DC. However, the first inductor L1 and the second inductor L2 whose inductance values are set to values of several nanohenries (nH) or less serve to provide a function of adjusting the impedance at frequencies near the frequency of the RF signal Pm. Accordingly, the collector impedance ZL_Q1 of the transistor Q1 can be adjusted.

Case where the Inductance Values of the First Inductor L1 and the Second Inductor L2 are Sufficiently Increased As described above, the first inductor L1 and the second inductor L2 whose inductance values are set to sufficiently large values serve to provide a choke function.

Figure 53:
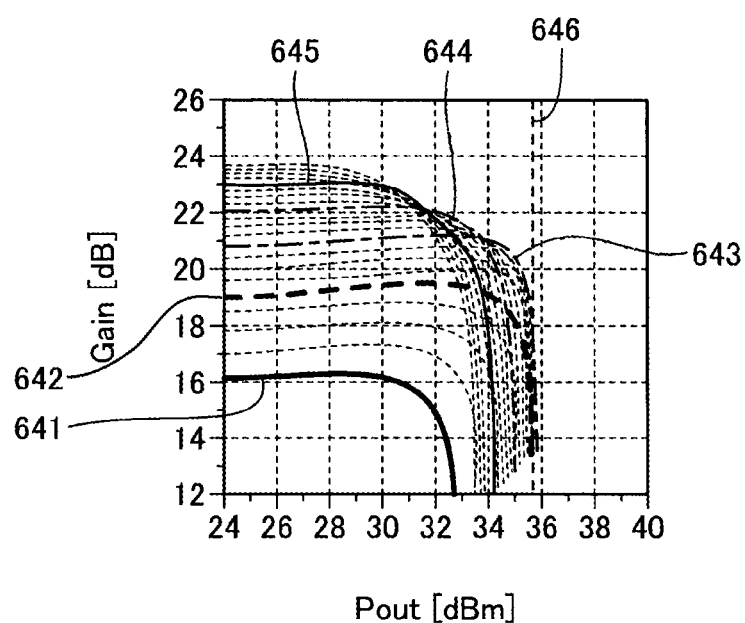
FIG. 53 illustrates circuit simulation results of a power amplifier circuit according to a sixth embodiment.
Figure 54:
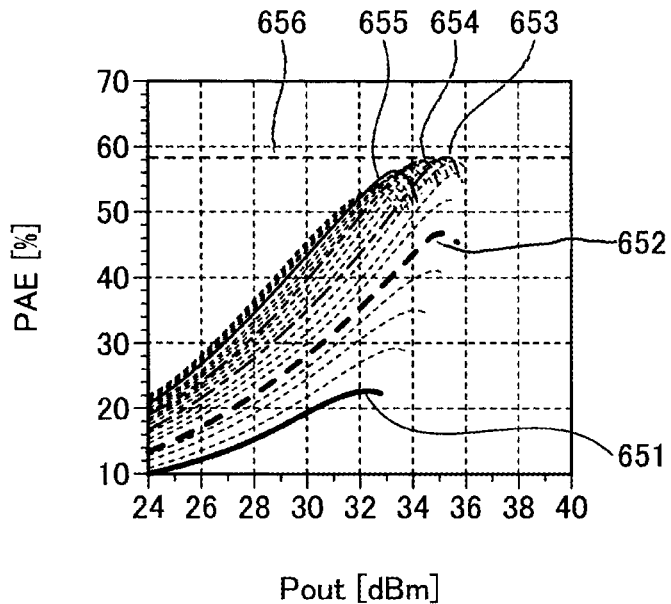
FIG. 54 illustrates circuit simulation results of the power amplifier circuit according to the sixth embodiment.
Figure 55:
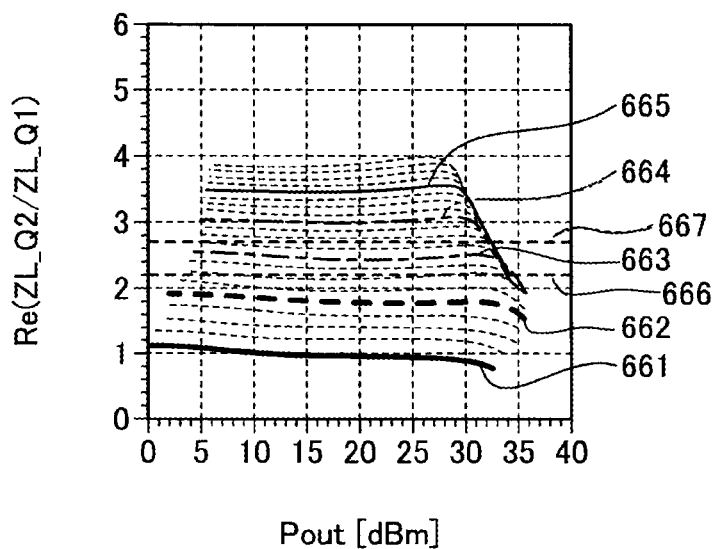
FIG. 55 illustrates circuit simulation results of the power amplifier circuit according to the sixth embodiment.

FIGS. 53 to 55 illustrate circuit simulation results of the power amplifier circuit 1 according to the sixth embodiment. Here, the inductance values of the first inductor L1 and the second inductor L2 were set to 20 nH.

FIG. 53 illustrates a relationship between the signal strength (dBm) of the RF output signal Pout and the gain (dB) of the power amplifier 2.

Line 641 represents the locus of the gain of the power amplifier 2 when the collector impedance ZL_Q2 of the transistor Q2 was set to 2Ω. Line 642 represents the locus of the gain of the power amplifier 2 when the collector impedance ZL_Q2 of the transistor Q2 was set to 4Ω.

Line 643 represents the locus of the gain of the power amplifier 2 when the collector impedance ZL_Q2 of the transistor Q2 was set to 6Ω. Line 644 represents the locus of the gain of the power amplifier 2 when the collector impedance ZL_Q2 of the transistor Q2 was set to 8Ω. Line 645 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 6Ω ((6±α) Ω), thereby obtaining high gain. It is indicated that, for example, the collector impedance ZL_Q2 of the transistor Q2 is set to 6Ω, thereby obtaining gain with respect to the signal strength of the RF output signal Pout up to about 35.6 dBm, which is indicated by line 646.

FIG. 54 illustrates a relationship between the signal strength (dBm) of the RF output signal Pout and the power-added efficiency (%) of the power amplifier 2.

Line 651 represents the locus of the power-added efficiency of the power amplifier 2 when the collector impedance ZL_Q2 of the transistor Q2 was set to 2Ω. Line 652 represents the locus of the power-added efficiency of the power amplifier 2 when the collector impedance ZL_Q2 of the transistor Q2 was set to 4Ω.

Line 653 represents the locus of the power-added efficiency of the power amplifier 2 when the collector impedance ZL_Q2 of the transistor Q2 was set to 6Ω. Line 654 represents the locus of the power-added efficiency of the power amplifier 2 when the collector impedance ZL_Q2 of the transistor Q2 was set to 8Ω. Line 655 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 6Ω ((6±α) Ω), thereby obtaining high power-added efficiency. It is indicated that, for example, the collector impedance ZL_Q2 of the transistor Q2 is set to 6Ω, thereby obtaining a power-added efficiency of about 59%, which is indicated by line 656.

FIG. 55 illustrates a relationship between the signal strength (dBm) of the RF output signal Pout and the impedance ratio.

Line 661 represents the locus of the impedance ratio when the collector impedance ZL_Q2 of the transistor Q2 was set to 2Ω. Line 662 represents the locus of the impedance ratio when the collector impedance ZL_Q2 of the transistor Q2 was set to 4Ω.

Line 663 represents the locus of the impedance ratio when the collector impedance ZL_Q2 of the transistor Q2 was set to 6Ω. Line 664 represents the locus of the impedance ratio when the collector impedance ZL_Q2 of the transistor Q2 was set to 8Ω. Line 665 represents the locus of the impedance ratio when the collector impedance ZL_Q2 of the transistor Q2 was set to 10Ω.

FIGS. 53 and 54 indicate that setting the collector impedance ZL_Q2 of the transistor Q2 to about 6Ω ((6±α) Ω) can achieve a desired trade-off between the output power and power-added efficiency of the power amplifier 2. FIG. 55 indicates that the impedance ratio providing the desired trade-off ranges from about 2.2, which is indicated by line 666, to about 2.7, which is indicated by line 667.

In the power amplifier 2, therefore, setting the impedance ratio to be greater than or equal to about 2.2 and less than or equal to about 2.7 can achieve a desired trade-off between the output power and power-added efficiency of the power amplifier 2.

Case where the Inductance Value of the First Inductor L1 is Decreased

As described above, the first inductor L1 whose inductance value is set to a value of several nanohenries (nH) or less serves to provide a function of adjusting the impedance at frequencies near the frequency of the RF signal Pm.

Figure 56:
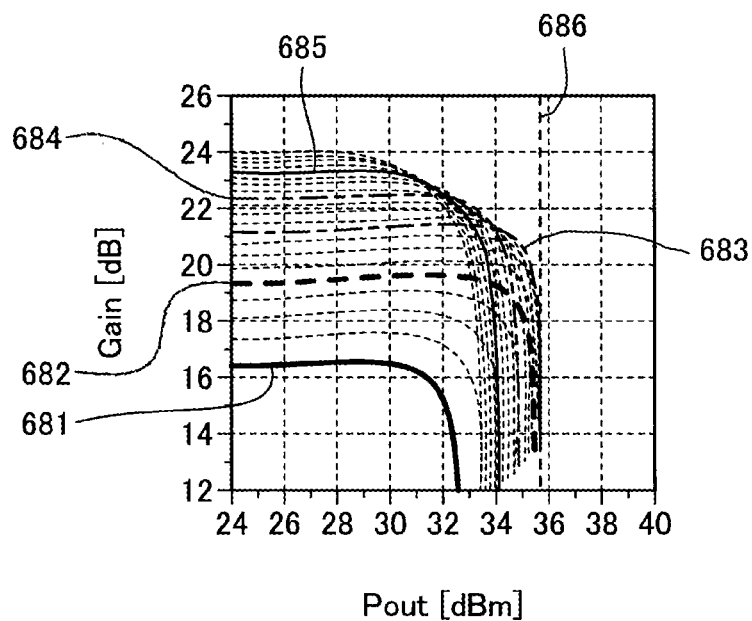
FIG. 56 illustrates circuit simulation results of the power amplifier circuit according to the sixth embodiment.
Figure 57:
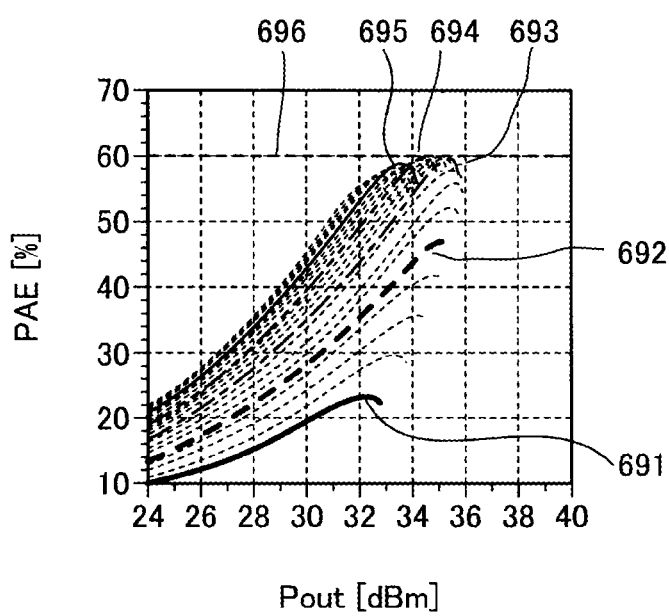
FIG. 57 illustrates circuit simulation results of the power amplifier circuit according to the sixth embodiment.
Figure 58:
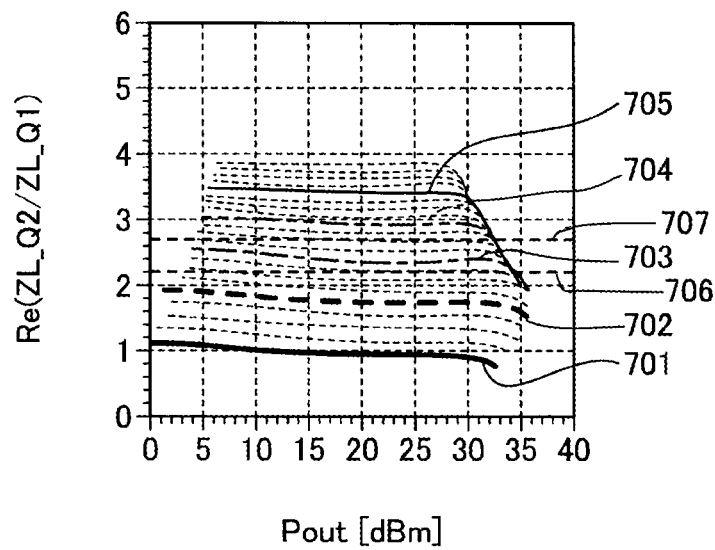
FIG. 58 illustrates circuit simulation results of the power amplifier circuit according to the sixth embodiment.

FIGS. 56 to 58 illustrate circuit simulation results of the power amplifier circuit 1 according to the sixth embodiment.

Here, the inductance value of the second inductor L2 was set to 20 nH, and the inductance value of the first inductor L1 was set to 1 nH.

FIG. 56 illustrates a relationship between the signal strength (dBm) of the RF output signal Pout and the gain (dB) of the power amplifier 2.

Line 681 represents the locus of the gain of the power amplifier 2 when the collector impedance ZL_Q2 of the transistor Q2 was set to 2Ω. Line 682 represents the locus of the gain of the power amplifier 2 when the collector impedance ZL_Q2 of the transistor Q2 was set to 4Ω.

Line 683 represents the locus of the gain of the power amplifier 2 when the collector impedance ZL_Q2 of the transistor Q2 was set to 6Ω. Line 684 represents the locus of the gain of the power amplifier 2 when the collector impedance ZL_Q2 of the transistor Q2 was set to 8Ω. Line 685 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 6Ω ((6±α) Ω), thereby obtaining high gain. It is indicated that, for example, the collector impedance ZL_Q2 of the transistor Q2 is set to 6Ω, thereby obtaining gain with respect to the signal strength of the RF output signal Pout up to about 35.6 dBm, which is indicated by line 686.

FIG. 57 illustrates a relationship between the signal strength (dBm) of the RF output signal Pout and the power-added efficiency (%) of the power amplifier 2.

Line 691 represents the locus of the power-added efficiency of the power amplifier 2 when the collector impedance ZL_Q2 of the transistor Q2 was set to 2Ω. Line 692 represents the locus of the power-added efficiency of the power amplifier 2 when the collector impedance ZL_Q2 of the transistor Q2 was set to 4Ω.

Line 693 represents the locus of the power-added efficiency of the power amplifier 2 when the collector impedance ZL_Q2 of the transistor Q2 was set to 6Ω. Line 694 represents the locus of the power-added efficiency of the power amplifier 2 when the collector impedance ZL_Q2 of the transistor Q2 was set to 8Ω. Line 695 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 6Ω ((6±α) Ω), thereby obtaining high power-added efficiency. It is indicated that, for example, the collector impedance ZL_Q2 of the transistor Q2 is set to 6Ω, thereby obtaining a power-added efficiency of about 60%, which is indicated by line 696.

In FIG. 57, compared to FIG. 54, the power-added efficiency improves when the collector impedance ZL_Q2 of the transistor Q2 is about 8Ω to about 10Ω. It is indicated that, for example, the collector impedance ZL_Q2 of the transistor Q2 is set to 8Ω, thereby obtaining a power-added efficiency of about 60%, which is indicated by line 696.

FIG. 58 illustrates a relationship between the signal strength (dBm) of the RF output signal Pout and the impedance ratio.

Line 701 represents the locus of the impedance ratio when the collector impedance ZL_Q2 of the transistor Q2 was set to 2Ω. Line 702 represents the locus of the impedance ratio when the collector impedance ZL_Q2 of the transistor Q2 was set to 4Ω.

Line 703 represents the locus of the impedance ratio when the collector impedance ZL_Q2 of the transistor Q2 was set to 6Ω. Line 704 represents the locus of the impedance ratio when the collector impedance ZL_Q2 of the transistor Q2 was set to 8Ω. Line 705 represents the locus of the impedance ratio when the collector impedance ZL_Q2 of the transistor Q2 was set to 10Ω.

FIGS. 56 and 57 indicate that setting the collector impedance ZL_Q2 of the transistor Q2 to about 6Ω ((6±α) Ω) can achieve a desired trade-off between the output power and power-added efficiency of the power amplifier 2. FIG. 58 indicates that the impedance ratio providing the desired trade-off ranges from about 2.2, which is indicated by line 706, to about 2.7, which is indicated by line 707.

In the power amplifier 2, therefore, setting the impedance ratio to be greater than or equal to about 2.2 and less than or equal to about 2.7 can achieve a desired trade-off between the output power and power-added efficiency of the power amplifier 2.

Case where the Inductance Value of the Second Inductor L2 is Decreased

As described above, the second inductor L2 whose inductance value is set to a value of several nanohenries (nH) or less serves to provide a function of adjusting the impedance at frequencies near the frequency of the RF signal Pm.

Figure 59:
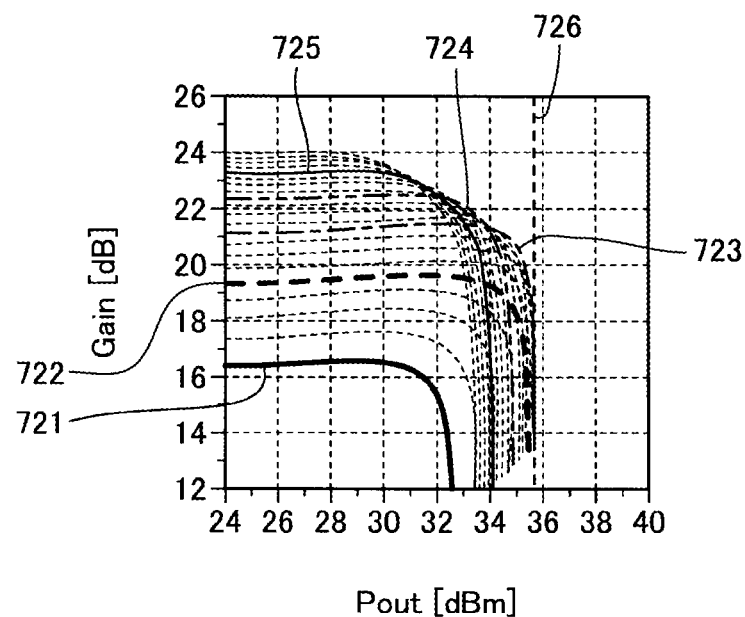
FIG. 59 illustrates circuit simulation results of the power amplifier circuit according to the sixth embodiment.
Figure 60:
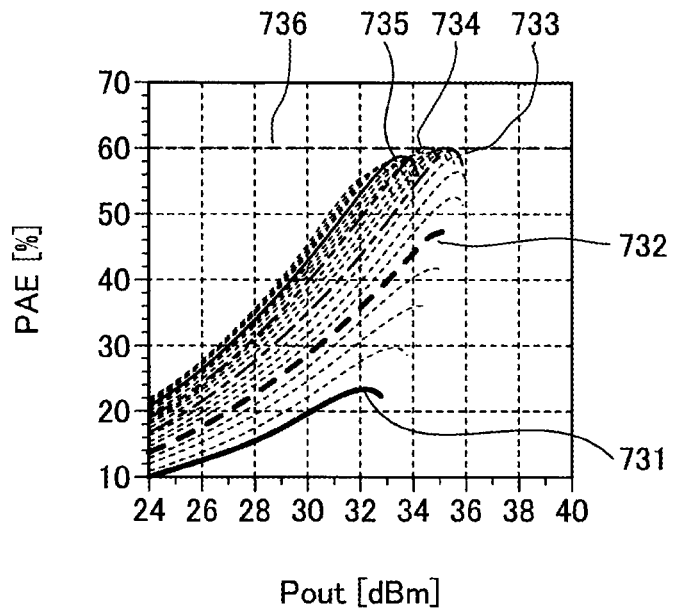
FIG. 60 illustrates circuit simulation results of the power amplifier circuit according to the sixth embodiment.
Figure 61:
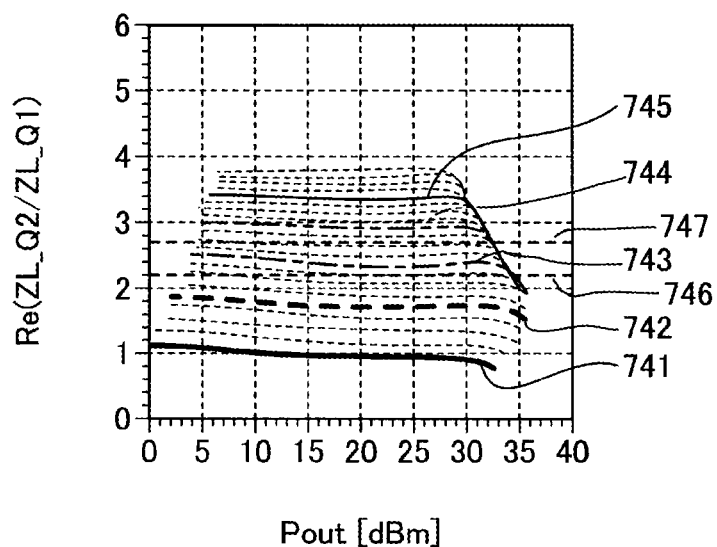
FIG. 61 illustrates circuit simulation results of the power amplifier circuit according to the sixth embodiment.

FIGS. 59 to 61 illustrate circuit simulation results of the power amplifier circuit 1 according to the sixth embodiment.

Here, the inductance value of the first inductor L1 was set to 20 nH, and the inductance value of the second inductor L2 was set to 1 nH.

FIG. 59 illustrates a relationship between the signal strength (dBm) of the RF output signal Pout and the gain (dB) of the power amplifier 2.

Line 721 represents the locus of the gain of the power amplifier 2 when the collector impedance ZL_Q2 of the transistor Q2 was set to 2Ω. Line 722 represents the locus of the gain of the power amplifier 2 when the collector impedance ZL_Q2 of the transistor Q2 was set to 4Ω.

Line 723 represents the locus of the gain of the power amplifier 2 when the collector impedance ZL_Q2 of the transistor Q2 was set to 6Ω. Line 724 represents the locus of the gain of the power amplifier 2 when the collector impedance ZL_Q2 of the transistor Q2 was set to 8Ω. Line 725 represents the locus of the gain of the power amplifier 2 when the collector impedance ZL_Q2 of the transistor Q2 was set to 10Ω.

It is indicated that in an area where the signal strength of the RF output signal Pout is high, the collector impedance ZL_Q2 of the transistor Q2 is set to about 6Ω ((6±α) Ω), thereby obtaining high gain. It is indicated that, for example, the collector impedance ZL_Q2 of the transistor Q2 is set to 6Ω, thereby obtaining gain with respect to the signal strength of the RF output signal Pout up to about 35.6 dBm, which is indicated by line 726.

FIG. 60 illustrates a relationship between the signal strength (dBm) of the RF output signal Pout and the power-added efficiency (%) of the power amplifier 2.

Line 731 represents the locus of the power-added efficiency of the power amplifier 2 when the collector impedance ZL_Q2 of the transistor Q2 was set to 2Ω. Line 732 represents the locus of the power-added efficiency of the power amplifier 2 when the collector impedance ZL_Q2 of the transistor Q2 was set to 4Ω.

Line 733 represents the locus of the power-added efficiency of the power amplifier 2 when the collector impedance ZL_Q2 of the transistor Q2 was set to 6Ω. Line 734 represents the locus of the power-added efficiency of the power amplifier 2 when the collector impedance ZL_Q2 of the transistor Q2 was set to 8Ω. Line 735 represents the locus of the power-added efficiency of the power amplifier 2 when the collector impedance ZL_Q2 of the transistor Q2 was set to 10Ω.

It is indicated that the collector impedance ZL_Q2 of the transistor Q2 is set to about 6Ω ((6±α) Ω), thereby obtaining high power-added efficiency. It is indicated that, for example, the collector impedance ZL_Q2 of the transistor Q2 is set to 6Ω, thereby obtaining a power-added efficiency of about 60%, which is indicated by line 736.

In FIG. 60, compared to FIG. 54, the power-added efficiency improves when the collector impedance ZL_Q2 of the transistor Q2 is about 8Ω to about 10Ω. It is indicated that, for example, the collector impedance ZL_Q2 of the transistor Q2 is set to 8Ω, thereby obtaining a power-added efficiency of about 60%, which is indicated by line 736.

FIG. 61 illustrates a relationship between the signal strength (dBm) of the RF output signal Pout and the impedance ratio.

Line 741 represents the locus of the impedance ratio when the collector impedance ZL_Q2 of the transistor Q2 was set to 2 Ω. Line 742 represents the locus of the impedance ratio when the collector impedance ZL_Q2 of the transistor Q2 was set to 4Ω.

Line 743 represents the locus of the impedance ratio when the collector impedance ZL_Q2 of the transistor Q2 was set to 6Ω. Line 744 represents the locus of the impedance ratio when the collector impedance ZL_Q2 of the transistor Q2 was set to 8Ω. Line 745 represents the locus of the impedance ratio when the collector impedance ZL_Q2 of the transistor Q2 was set to 10Ω.

FIGS. 59 and 60 indicate that setting the collector impedance ZL_Q2 of the transistor Q2 to about 6Ω ((6±α) Ω) can achieve a desired trade-off between the output power and power-added efficiency of the power amplifier 2. FIG. 61 indicates that the impedance ratio providing the desired trade-off ranges from about 2.2, which is indicated by line 746, to about 2.7, which is indicated by line 747.

In the power amplifier 2, therefore, setting the impedance ratio to be greater than or equal to about 2.2 and less than or equal to about 2.7 can achieve a desired trade-off between the output power and power-added efficiency of the power amplifier 2.

The embodiments described above are provided to facilitate understanding of the present disclosure and are not to be construed as limiting the present disclosure. The present disclosure may be modified or improved without necessarily departing from the spirit thereof, and the present disclosure also includes equivalents thereof.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
 a first bias circuit configured to output a first bias current or a first bias voltage;
 a second bias circuit configured to output a second bias current or a second bias voltage;
 a first transistor having an emitter, a base, and a collector, wherein the emitter of the first transistor is electrically connected to a reference potential, the first bias current or the first bias voltage is input to the base of the first transistor via a first resistor, a radio-frequency input signal is input to the base via a first capacitor, and the collector of the first transistor is electrically connected to a first power supply potential via a first inductor;
 a capacitor having a first end and a second end, the first end being electrically connected to the collector of the first transistor; and
 a second transistor having an emitter, a base, and a collector, wherein the emitter of the second transistor is electrically connected to the second end of the capacitor, the emitter of the second transistor is electrically connected to the reference potential via a second inductor, the second bias current or the second bias voltage is input to the base of the second transistor via a second resistor, the base of the second transistor is electrically connected to the reference potential via a second capacitor, the collector of the second transistor is electrically connected to the first power supply potential via a third inductor, and a radio-frequency output signal obtained by amplifying the radio-frequency input signal is output from the collector of the second transistor,
 wherein the second bias circuit comprises a third transistor having a collector, a base, and an emitter, wherein the collector of the third transistor is electrically connected to a second power supply potential, a third bias current or a third bias voltage is input to the base of the third transistor, and the second bias current or the second bias voltage is output from the emitter of the third transistor.

2. The power amplifier circuit according to claim 1, wherein the second bias circuit further comprises:
- a fourth inductor electrically connected between the emitter of the third transistor and the base of the second transistor, and
- a third capacitor electrically connected in parallel with the fourth inductor.

3. The power amplifier circuit according to claim 1, wherein the second bias circuit further comprises a fourth capacitor electrically connected between the emitter of the third transistor and the base of the third transistor.

4. The power amplifier circuit according to claim 1, wherein the second bias circuit further comprises a fourth transistor having a collector, a base, and an emitter, wherein the collector of the fourth transistor is electrically connected to the base of the third transistor, the base of the fourth transistor is electrically connected to the emitter of the third transistor, and the emitter is electrically connected to the reference potential.

5. The power amplifier circuit according to claim 1, wherein the second bias circuit further comprises a fifth transistor having a collector, a base, and an emitter, wherein the collector of the fifth transistor is electrically connected to the second power supply potential, a fourth bias current or a fourth bias voltage is input to the base of the fifth transistor, the radio-frequency input signal is input to the base of the fifth transistor, and the emitter of the fifth transistor is electrically connected to the emitter of the third transistor.

6. A power amplifier circuit comprising:
- a first bias circuit configured to output a first bias current or a first bias voltage;
- a second bias circuit configured to output a second bias current or a second bias voltage;
- a first transistor having an emitter, a base, and a collector, wherein the emitter of the first transistor is electrically connected to a reference potential, the first bias current or the first bias voltage is input to the base of the first transistor via a first resistor, a radio-frequency input signal is input to the base of the first transistor via a first capacitor, and the collector of the first transistor is electrically connected to a first power supply potential via a first inductor;
- a capacitor having a first end and a second end, the first end being electrically connected to the collector of the first transistor; and
- a second transistor having an emitter, a base, and a collector, wherein the emitter of the second transistor is electrically connected to the second end of the capacitor, the emitter of the second transistor is electrically connected to the reference potential via a second inductor, the second bias current or the second bias voltage is input to the base of the second transistor via a second resistor, the base of the second transistor is electrically connected to the reference potential via a second capacitor, the collector of the second transistor is electrically connected to the first power supply potential via a third inductor, and a radio-frequency output signal obtained by amplifying the radio-frequency input signal is output from the collector of the second transistor,
wherein a ratio of an impedance of the collector of the second transistor to an impedance of the collector of the first transistor is greater than or equal to 2.2 and less than or equal to 2.7.

7. The power amplifier circuit according to claim 6, wherein the second bias circuit comprises a third transistor having a collector, a base, and an emitter, wherein the collector of the third transistor is electrically connected to a second power supply potential, a third bias current or a third bias voltage is input to the base of the third transistor, and the second bias current or the second bias voltage is output from the emitter of the third transistor.

8. The power amplifier circuit according to claim 6, wherein the second bias circuit further comprises:
- a fourth inductor electrically connected between the emitter of the third transistor and the base of the second transistor, and
- a third capacitor electrically connected in parallel with the fourth inductor.

9. The power amplifier circuit according to claim 6, wherein the second bias circuit further comprises a fourth capacitor electrically connected between the emitter of the third transistor and the base of the third transistor.

10. The power amplifier circuit according to claim 6, wherein the second bias circuit further comprises a fourth transistor having a collector, a base, and an emitter, wherein the collector of the fourth transistor is electrically connected to the base of the third transistor, the base of the fourth transistor is electrically connected to the emitter of the third transistor, and the base is electrically connected to the reference potential.

11. The power amplifier circuit according to claim 6, wherein the second bias circuit further comprises a fifth transistor having a collector, a base, and an emitter, wherein the collector of the fifth transistor is electrically connected to the second power supply potential, a fourth bias current or a fourth bias voltage is input to the base of the fifth transistor, the radio-frequency input signal is input to the base of the fifth transistor, and the emitter of the fifth transistor is electrically connected to the emitter of the third transistor.

12. The power amplifier circuit according to claim 1, wherein the first bias circuit, the second bias circuit, the first transistor and the second transistor are heterojunction bipolar transistors.

13. The power amplifier circuit according to claim 1, wherein at least one part of the power amplifier circuit is on a semiconductor chip.

* * * * *

UNITED STATES PATENT AND TRADEMARK OFFICE
CERTIFICATE OF CORRECTION

PATENT NO. : 11,245,365 B2
APPLICATION NO. : 16/828630
DATED : February 8, 2022
INVENTOR(S) : Toshikazu Terashima et al.

It is certified that error appears in the above-identified patent and that said Letters Patent is hereby corrected as shown below:

In the Specification

Column 13, Line 2, "S2" should be -- $\Omega$ --.

Signed and Sealed this
Eighth Day of November, 2022

*Katherine Kelly Vidal*
*Director of the United States Patent and Trademark Office*